United States Patent
Koh et al.

(10) Patent No.: US 11,194,752 B2
(45) Date of Patent: Dec. 7, 2021

(54) MEMORY CARD AND ELECTRONIC SYSTEM

(71) Applicant: SAMSUNG ELECTRONICS CO., LTD., Suwon-si (KR)

(72) Inventors: Yong-nam Koh, Suwon-si (KR); Kyoung-bum Kim, Seoul (KR); In-jae Lee, Hwaseong-si (KR); Jae-heon Jeong, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/993,906

(22) Filed: Aug. 14, 2020

(65) Prior Publication Data
US 2020/0371983 A1 Nov. 26, 2020

Related U.S. Application Data

(63) Continuation of application No. 16/239,183, filed on Jan. 3, 2019, now Pat. No. 10,769,091.

(30) Foreign Application Priority Data

Jan. 3, 2018 (KR) .......................... 10-2018-0000913

(51) Int. Cl.
| | | |
|---|---|---|
| G06F 13/40 | (2006.01) | |
| G06F 12/02 | (2006.01) | |
| H05K 5/02 | (2006.01) | |

(52) U.S. Cl.
CPC ...... *G06F 13/4081* (2013.01); *G06F 12/0246* (2013.01); *H05K 5/026* (2013.01); *G06F 2212/7206* (2013.01)

(58) Field of Classification Search
CPC ........ G06K 19/07732; G06K 19/07743; G06F 13/4068; G06F 13/4081; G06F 12/0246; G06F 2212/7206
See application file for complete search history.

(56) References Cited

U.S. PATENT DOCUMENTS

| | | |
|---|---|---|
| 7,055,757 B2 | 6/2006 | Nishizawa et al. |
| 7,069,369 B2 | 6/2006 | Chou et al. |
| (Continued) | | |

FOREIGN PATENT DOCUMENTS

| | | |
|---|---|---|
| JP | 2008-83888 A | 4/2008 |
| JP | 4236440 B2 | 3/2009 |
| (Continued) | | |

OTHER PUBLICATIONS

"SD + PCIe/NVMe card New Innovations in SD Cards Lead the Way to Mobile Everything"—Flash Memory Summit, By Yosi Pinto; Dated Aug. 9, 2017; 21 Pages. (Year: 2017).

*Primary Examiner* — Brian T Misiura
(74) *Attorney, Agent, or Firm* — Sughrue Mion, PLLC

(57) ABSTRACT

A memory card includes a card substrate on which a controller and a memory device are mounted, and a card enclosure that accommodates the card substrate and exposes terminals for electrical connection to an external device. The controller is operable in a universal flash storage (UFS) mode and in a first sub-mode other than the UFS mode. The terminals that are exposed include a UFS terminal group according to a UFS standard, and a first sub-mode terminal group. The UFS terminal group includes first row terminals arranged adjacent to an insertion side edge of the memory card and second row terminals arranged apart from the insertion side edge such that the first row terminals are provided between the second row terminals and the insertion side edge. The first sub-mode terminal group is adjacent to the first row terminals.

20 Claims, 27 Drawing Sheets

(56) References Cited

U.S. PATENT DOCUMENTS

| | | |
|---|---|---|
| 7,281,951 B2 | 10/2007 | Aoki |
| 7,516,903 B2 | 4/2009 | Nishizawa et al. |
| 7,552,876 B2 | 6/2009 | Nishizawa et al. |
| 7,664,902 B1 | 2/2010 | Chow et al. |
| 7,694,067 B2 | 4/2010 | Mizushima et al. |
| 8,301,822 B2* | 10/2012 | Pinto .................... G06F 3/0661 |
| | | 710/315 |
| 8,955,758 B2 | 2/2015 | Thill et al. |
| 9,299,436 B2 | 3/2016 | Nakamura et al. |
| 9,367,447 B2 | 6/2016 | Shacham et al. |
| 9,552,318 B2 | 1/2017 | Shin et al. |
| 9,753,503 B2 | 9/2017 | Han et al. |
| 9,830,993 B2 | 11/2017 | Kong et al. |
| 10,027,079 B2* | 7/2018 | Lu .................... G06K 19/07732 |
| 10,380,055 B2 | 8/2019 | Han et al. |
| 2004/0070952 A1 | 4/2004 | Higuchi et al. |
| 2008/0006704 A1 | 1/2008 | Kim |
| 2014/0051353 A1 | 2/2014 | Nakamura |
| 2017/0003717 A1 | 1/2017 | Yew et al. |
| 2017/0148492 A1 | 5/2017 | Han et al. |
| 2017/0206974 A1* | 7/2017 | Kong .................... G06F 3/0625 |
| 2018/0088865 A1* | 3/2018 | Lee ................. G06K 19/07743 |

FOREIGN PATENT DOCUMENTS

| | | |
|---|---|---|
| JP | 2013-178758 A | 9/2013 |
| JP | 2015-141618 A | 8/2015 |
| KR | 10-2006-0057794 A | 5/2006 |
| KR | 10-2016-0004175 A | 1/2016 |

* cited by examiner

US 11,194,752 B2

MEMORY CARD AND ELECTRONIC SYSTEM

CROSS-REFERENCE TO RELATED APPLICATION

This application is a continuation of U.S. patent application Ser. No. 16/239,183, filed on Jan. 3, 2019, in the United States Patent and Trademark Office, which claims priority from Korean Patent Application No. 10-2018-0000913, filed on Jan. 3, 2018, in the Korean Intellectual Property Office, the disclosures of each of which are incorporated by reference herein in their entireties.

BACKGROUND

Apparatuses, devices, articles of manufacture and systems consistent with the present disclosure relate to a memory card and an electronic system, and more particularly, to a memory card and an electronic system which are capable of coping with different types of sockets and memory cards.

Recently, new memory cards having various specifications have been proposed, and from the viewpoint of a host, there is a problem in compatibility between these new memory cards and conventional memory cards that have been standardized and commercialized.

SUMMARY

It is an aspect to provide a memory card having high reliability and ease of use.

It is another aspect to provide an electronic system including a card socket having high reliability and ease of use.

According to an aspect of the inventive concept, there is provided a memory card including a card substrate on which a controller and a memory device are mounted; and a card enclosure that accommodates the card substrate and exposes a plurality of terminals for electrical connection to an external device, wherein the controller is configured to be operable in a universal flash storage (UFS) mode and in a first sub-mode other than the UFS mode, wherein the plurality of terminals that are exposed comprise a UFS terminal group according to a UFS standard, the UFS terminal group comprising a plurality of first row terminals arranged adjacent to an insertion side edge of the memory card and a plurality of second row terminals arranged apart from the insertion side edge such that the plurality of first row terminals are provided between the plurality of second row terminals and the insertion side edge; and a first sub-mode terminal group adjacent to the plurality of first row terminals.

According to another aspect of the inventive concept, there is provided an electronic system including a controller; an input/output device; a memory; an interface that electrically communicates with an external device; and a bus that communicatively connects the controller, the input/output device, the memory, and the interface to each other, wherein the interface comprises a card socket configured to accommodate a memory card, wherein the card socket comprises a first connection pin connectable to a card detection terminal of a universal flash storage (UFS) card when the UFS card is inserted in the card socket, and wherein, when a memory card is inserted in the card socket, the controller is configured to detect the memory card as a UFS card when a voltage of the first connection pin is lower than a first reference voltage and to supply a first voltage to a power supply terminal of the UFS card, and is configured to detect the memory card as a micro secure digital (SD) card or a peripheral component interconnect express (PCIe) card when the voltage of the first connection pin is higher than the first reference voltage.

According to another aspect of the inventive concept, there is provided an electronic system including a controller; an input/output device; a memory; an interface that electrically communicates with an external device; and a bus that communicatively connects the controller, the input/output device, the memory, and the interface to each other, wherein the interface comprises a card socket configured to accommodate a memory card, wherein the card socket comprises a first connection pin connectable to a card detection terminal of a universal flash storage (UFS) card when the UFS card is inserted in the card socket; a second connection pin connectable to a reference clock terminal of the UFS card when the UFS card is inserted in the card socket; a third connection pin connectable to a DAT2 terminal of a micro secure digital (SD) card when the micro SD card is inserted in the card socket; and a fourth connection pin connectable to a command (CMD) terminal of the micro SD card when the micro SD card is inserted in the card socket.

BRIEF DESCRIPTION OF THE DRAWINGS

Various example embodiments will be more clearly understood from the following detailed description taken in conjunction with the accompanying drawings in which.

DETAILED DESCRIPTION

Figure 1:
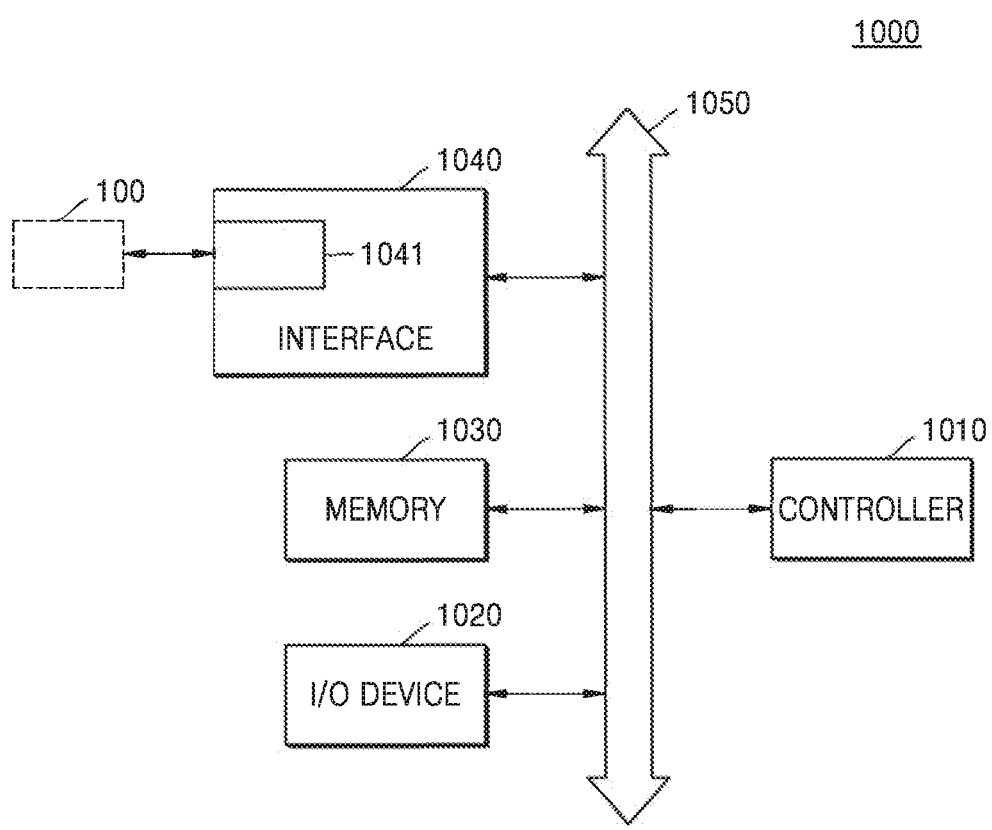
FIG. 1 is a block diagram of an electronic system according to an example embodiment.

Hereinafter, example embodiments will be described in detail with reference to the accompanying drawings. Like reference numerals denote like elements in the drawings, and redundant description thereof will be omitted. In this specification, the phrase "at least one of A and B" includes "A alone", "B alone", and "both A and B".

FIG. 1 is a block diagram of an electronic system 1000 according to an example embodiment.

Referring to FIG. 1, the electronic system 1000 includes a controller 1010, an input/output (I/O) device 1020, a memory 1030, and an interface 1040, which are connected to each other via a bus 1050.

The controller 1010 may include at least one of a microprocessor, a digital signal processor, and/or a processing device similar thereto. The I/O device 1020 may include at least one of a keypad, a keyboard, and a display. The memory 1030 may be used to store instructions executed by the controller 1010. For example, the memory 1030 may be used to store user data.

The electronic system 1000 may constitute a wireless communication device, or an apparatus capable of transmitting and/or receiving information under a wireless environment. To transmit and/or receive data through a wired or wireless communication network in the electronic system 1000, the interface 1040 may be configured as a wired or wireless interface. The interface 1040 may include a card socket 1041, an antenna, and/or a wireless transceiver. In some example embodiments, the electronic system 1000 may be used in a communication interface protocol of a third generation communication system, such as code division multiple access (CDMA), global system for mobile communications (GSM), north American digital cellular (NADC), extended-time division multiple access (E-TDMA), and/or wide band code division multiple access (WCDMA).

The card socket 1041 may be configured to accommodate the memory card 100.

Figure 2A:
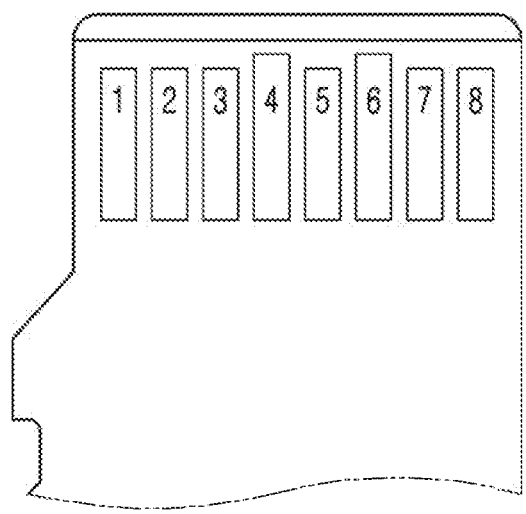
FIGS. 2A to 2C illustrate memory cards which may be accommodated by a card socket.
Figure 2B:
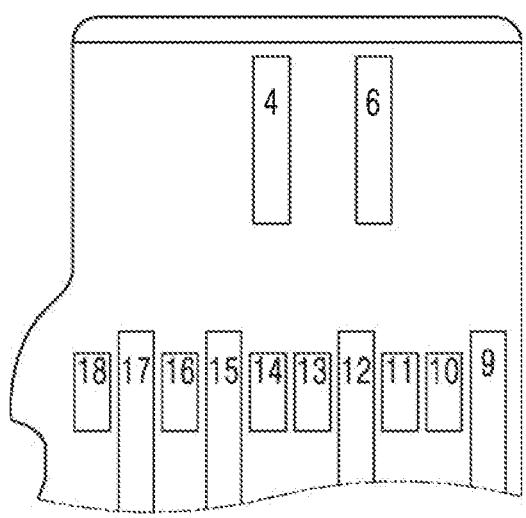
Figure 2C:
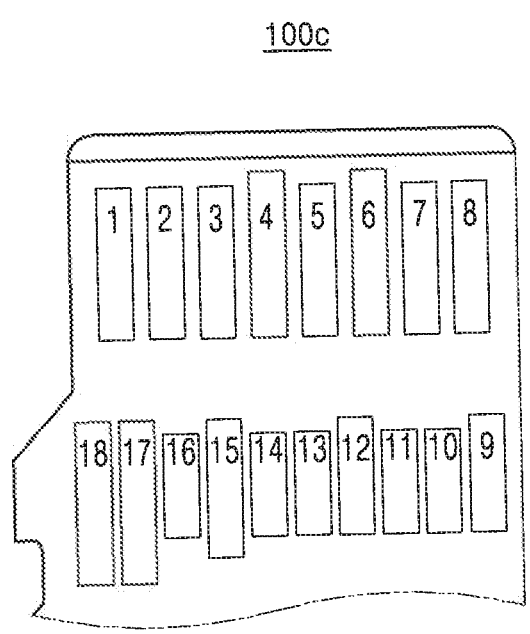

FIGS. 2A to 2C illustrate memory cards 100*a*, 100*b*, and 100*c*, respectively, which may be accommodated by the card socket 1041. However, the illustrated memory cards 100*a*, 100*b*, and 100*c* are only examples, and the memory cards that may be accommodated by the card socket 1041 are not limited to the memory cards 100*a*, 100*b*, and 100*c* shown in FIGS. 2A-2C.

Referring to FIG. 2A, the memory card 100*a* is a micro secure digital (SD) card according to an SD standard. Functions assigned to terminals of the memory card 100*a* that is a micro SD card are as shown in Table 1.

TABLE 1

| | |
|---|---|
| 1 | DAT2 |
| 2 | CD/DAT3 |
| 3 | CMD |
| 4 | VDD1 |
| 5 | CLK |
| 6 | VSS |
| 7 | DAT0 |
| 8 | DAT1 |

Referring to FIG. 2B, the memory card 100*b* is a universal flash storage (UFS) card according to a UFS standard. Functions assigned to terminals of the memory card 100*b* that is a UFS card are as shown in Table 2.

TABLE 2

| | |
|---|---|
| 1 | — |
| 2 | — |
| 3 | — |
| 4 | VCC |

TABLE 2-continued

| | |
|---|---|
| 5 | — |
| 6 | VSS |
| 7 | — |
| 8 | — |
| 9 | VSS |
| 10 | DIN_C |
| 11 | DIN_T |
| 12 | VSS |
| 13 | DOUT_C |
| 14 | DOUT_T |
| 15 | VSS |
| 16 | REF_CLK |
| 17 | VCCQ2 |
| 18 | CD (GND) |

Referring to FIG. 2C, the memory card 100*c* is an exemplary memory card employing a peripheral component interconnect express (PCIe) interface, that is, a PCIe card. Functions assigned to terminals of the memory card 100*c* that is a PCIe card are as shown in Table 3.

TABLE 3

| | Option 1 | Option 2 |
|---|---|---|
| 1 | PCIe CLKREQ | PCIe CLKREQ |
| 2 | — | — |
| 3 | PCIe Reset | PCIe Reset |
| 4 | VDD1 | VDD1 (3.3 V) |
| 5 | — | — |
| 6 | VSS | VSS |
| 7 | PCIe REFCLK+ | PCIe REFCLK+ |
| 8 | PCIe REFCLK− | PCIe REFCLK− |
| 9 | VSS | VSS |
| 10 | PCIe RX− | PCIe RX− |
| 11 | PCIe RX+ | PCIe RX+ |
| 12 | VSS | VSS |
| 13 | PCIe_TX− | PCIe_TX− |
| 14 | PCIe_TX+ | PCIe_TX+ |
| 15 | VSS | VSS |
| 16 | Detection (GND) | VDD3 (1.2 V) |
| 17 | — | VDD2 (1.8 V) |
| 18 | VDD3 | Reserved |

The physical positions of the terminals of each of the memory cards 100*a*, 100*b*, and 100*c* shown in FIGS. 2A to 2C may be somewhat changed. In some example embodiments, the physical positions of the terminals of each of the memory cards 100*a*, 100*b*, and 100*c* may be slightly different from those shown in FIGS. 2A to 2C, but the arrangement order of the terminals is the same as that shown in FIGS. 2A to 2C. That is, in some example embodiments the physical positions of the terminals may be, for example, located farther from the edge of the memory card than is shown in FIGS. 2A-2C. In some example embodiments, the physical positions of the terminals of each of the memory cards 100*a*, 100*b*, and 100*c* may be slightly different from those shown in FIGS. 2A to 2C, but the arrangement order of terminals for power supply and ground is the same as that shown in FIGS. 2A to 2C and the arrangement order of the other terminals are partially changeable.

Figure 3:
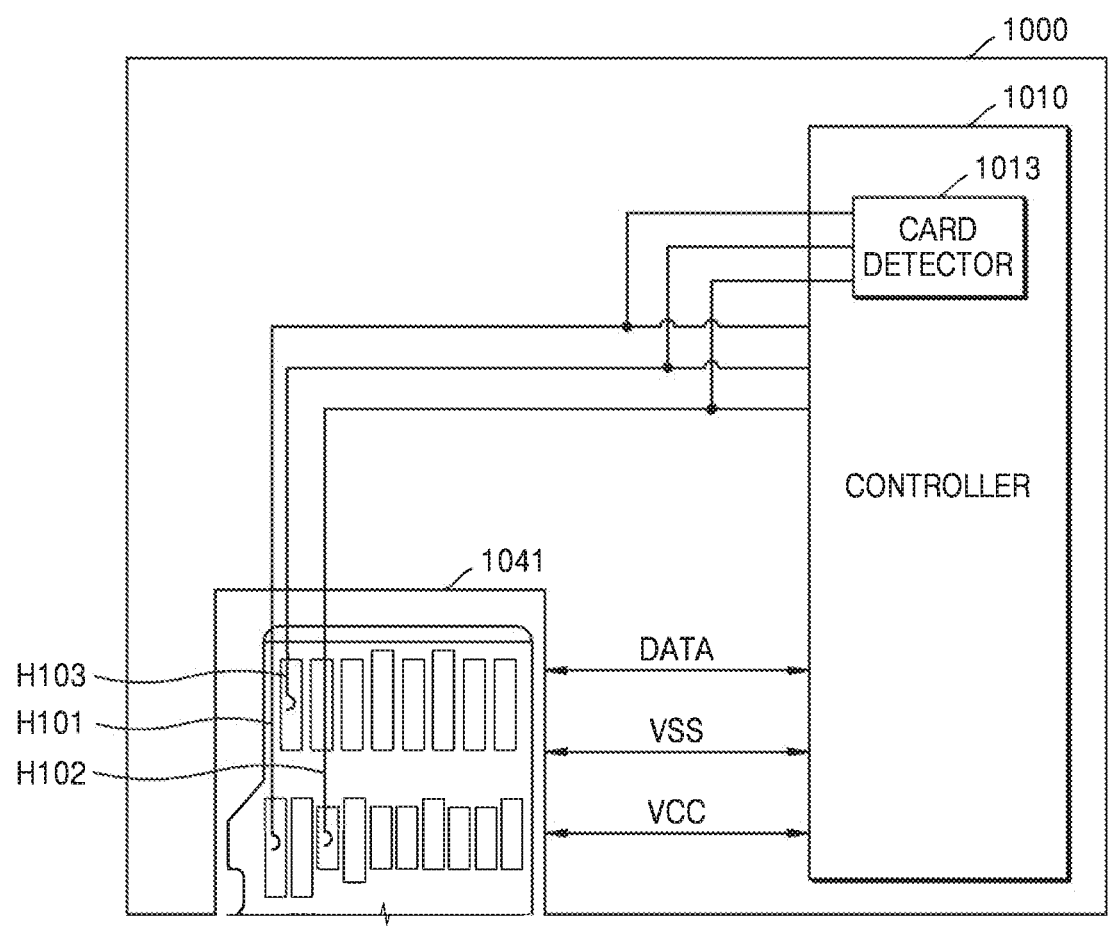
FIG. 3 is a conceptual diagram illustrating a portion of an electronic system according to an example embodiment.

FIG. 3 is a conceptual diagram illustrating a part of an electronic system 1000 according to an example embodiment.

Referring to FIG. 3, the electronic system 1000 may include a card socket 1041 and a controller 1010. The controller 1010 may include a card detector 1013 capable of recognizing a type of memory card inserted in the card socket 1041. For example, the card detector 1013 may be configured to detect at least two of a micro SD card, a UFS card, and a PCIe card.

The card socket 1041 may have a first connection pin H101 corresponding to a card detection (CD) terminal of the UFS card when the UFS card is inserted. When the UFS card is inserted in the card socket 1041, a terminal connected to the first connection pin H101 may be grounded.

In some example embodiments, the card socket 1041 may further include a second connection pin H102 corresponding to a reference clock REF_CLK (see Table 2) terminal of the UFS card when the UFS card is inserted. In some example embodiments, the card socket 1041 may further include a third connection pin H103 connectable to a DAT2 terminal (see Table 1) of the micro SD card when the micro SD card is inserted.

The card socket 1041 may further include additional connection pins for power supply, ground, and data input/output in addition to the first to third connection pins H101, H102, and H103.

The first to third connection pins H101, H102, and H103 may be connected to the card detector 1013 because they may be used for a card detection function. In some example embodiments, the first to third connection pins H101, H102, and H103 may be connected to the controller 1010 separately from the card detector 1013 because they may further perform functions other than the card detection function as the case may be. That is, in some example embodiments, the first to third connection pins H101, H102, and H103 may be connected to the controller in addition to being connected to the card detector 1013 of the controller 1010.

A conventional UFS card socket is configured to determine whether a CD terminal of a memory card inserted therein is grounded and to determine whether the inserted memory card is a UFS card or a non-UFS card. The electronic system 1000 of FIG. 3 may be configured to identify two or more memory cards and be operable in an operation mode corresponding to an identified memory card.

Specifically, the controller 1010 may be configured to operate in an operation mode corresponding to a detected memory card.

Figure 4:
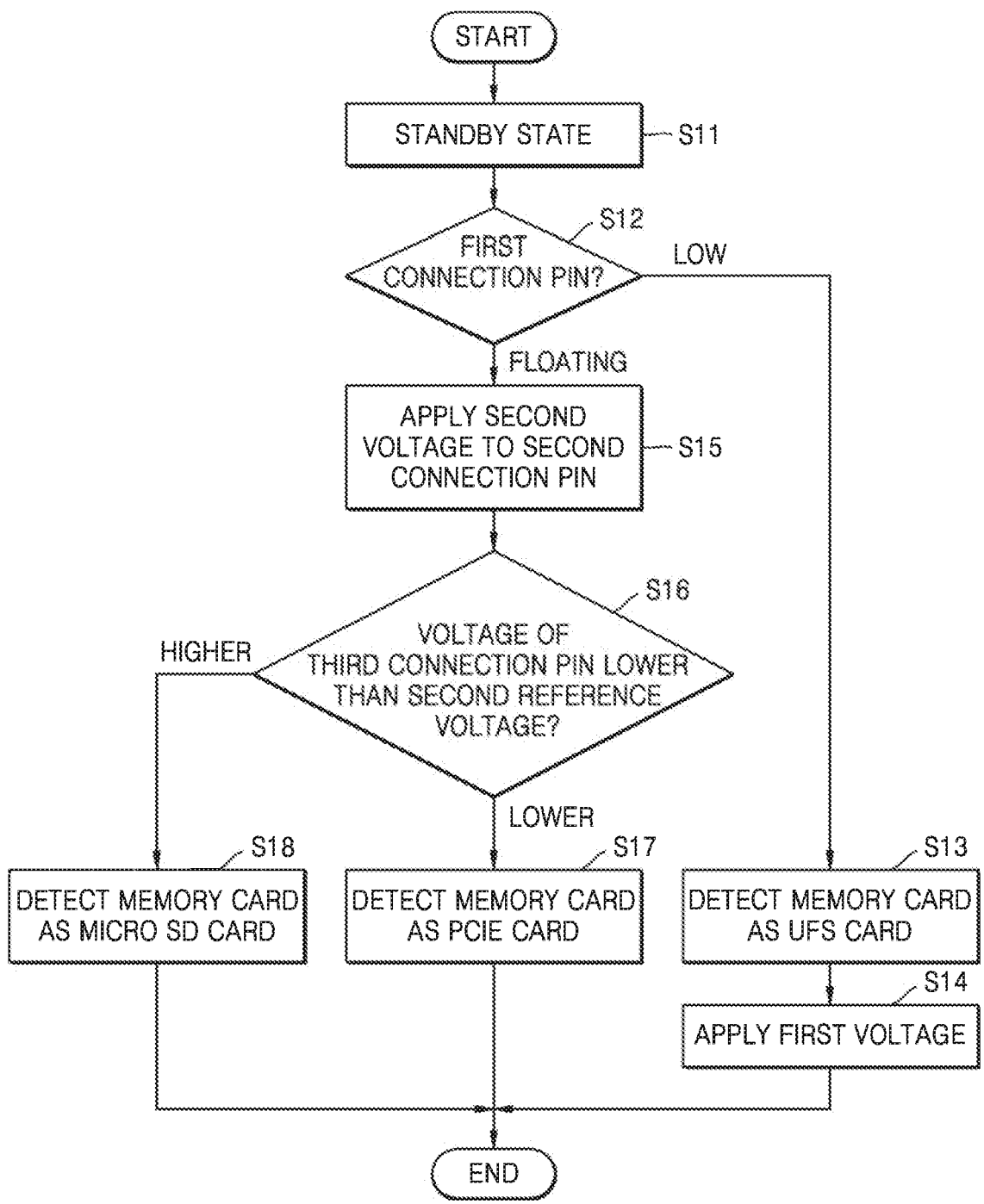
FIGS. 4 to 7 are flowcharts illustrating methods by which an electronic system determines a type of memory card inserted in a card socket, according to example embodiments.

FIG. 4 is a flowchart illustrating a method by which the electronic system 1000 determines a type of memory card inserted in the card socket 1041, according to an example embodiment.

Referring to FIGS. 3 and 4, before a memory card is inserted, the card socket 1041 may be in a standby state (Operation S11). The standby state denotes that the card socket 1041 is empty.

The card detector 1013 may be connected to the first to third connection pins H101, H102 and H103 as described above. When the voltage of the first connection pin H101 is lower than a first reference voltage (e.g., 1.65 volt), the card detector 1013 may determine that the voltage of the first connection pin H101 is low (i.e., the signal applied to the first connection pin H101 is a low signal) (Operation S12, LOW), and may identify a memory card inserted in the card socket 1041 as a UFS card (Operation S13). Since the memory card inserted in the card socket 1041 is identified as a UFS card in Operation S13, a power source having a first voltage (e.g., approximately 1.8 volt) may be applied to a power terminal of the UFS card (Operation S14) and follow-up work may be performed.

When the first connection pin H101 is in a floating state (Operation 12, FLOATING), a power source having a second voltage (e.g., about 1.2 volt) may be applied to the second connection pin H102 (Operation S15). However, in some example embodiments, the second voltage may be applied before the floating of the first connection pin H101. When the voltage of the third connection pin H103 is lower than a second reference voltage (e.g., 1.65 volt) (Operation S16, LOWER), the card detector 1013 may detect the inserted memory card as a PCIe card (Operation S17). When the voltage of the third connection pin H103 is higher than the second reference voltage (Operation S16, HIGHER), the inserted memory card may be detected as a micro SD card and the card detection process may be terminated (Operation S18).

Since the electronic system 1000 is capable of detecting the micro SD card, the UFS card, and the PCIe card, various cards may be accommodated and used in the electronic system 1000.

Figure 5:
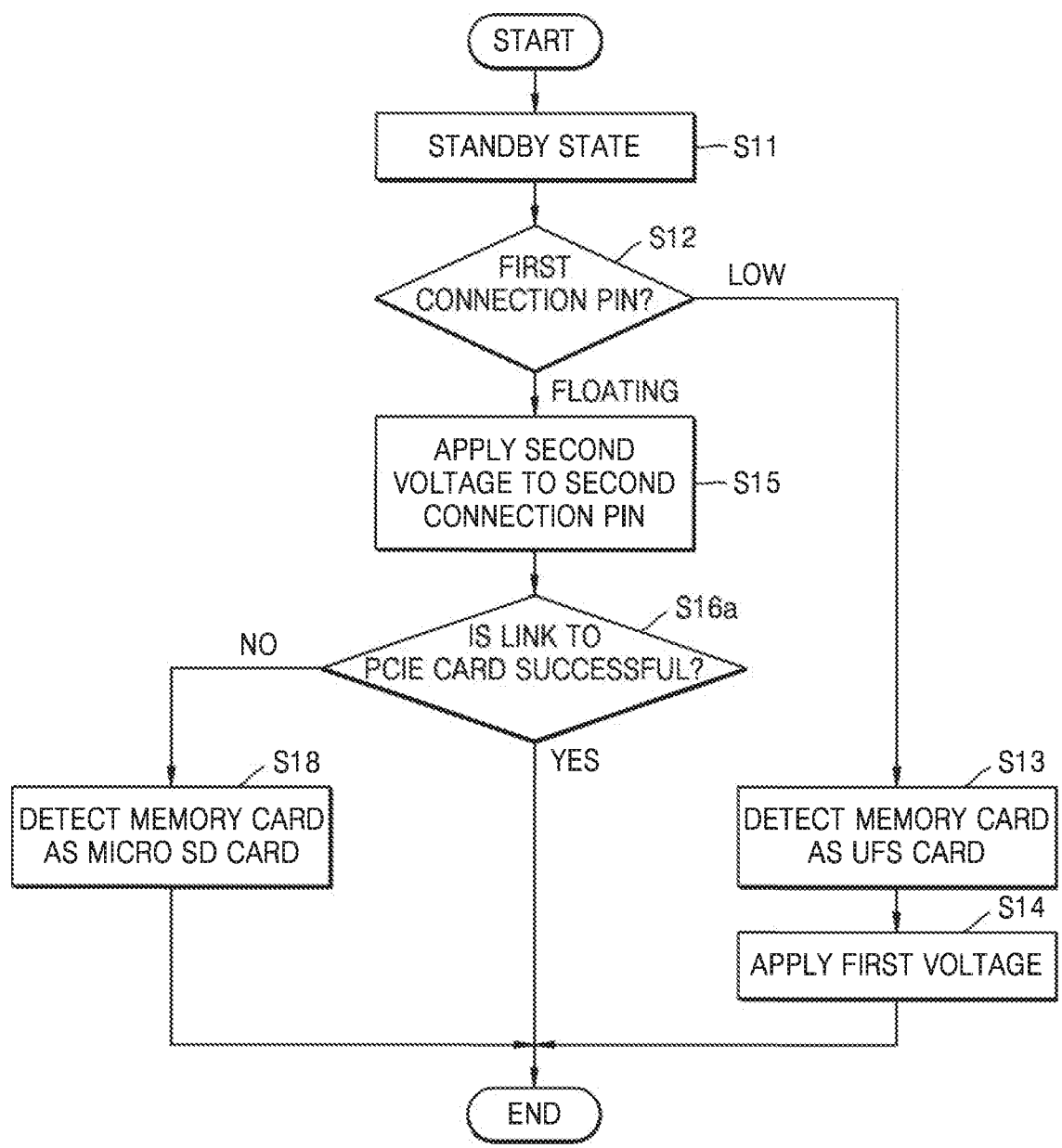

FIG. 5 is a flowchart illustrating a method by which the electronic system 1000 determines a type of memory card inserted in the card socket 1041, according to another example embodiment. The example embodiment shown in FIG. 5 differs from the example embodiment shown in FIG. 4 in operations after the operation (Operation S15) in which when the first connection pin H101 is in a floating state, and the power source having the second voltage is applied to the second connection pin H102. Therefore, hereinafter, operations after the operation (Operation S15) in which the power source having the second voltage is applied to the second connection pin H102 is described.

Referring to FIGS. 3 and 5, after the power source having the second voltage is applied to the second connection pin H102 (Operation S15), a link to a PCIe card may be continuously tried assuming that the inserted memory card is a PCIe card (Operation S16a). In some other example embodiments, a link to a PCIe card may be continuously tried in a floating state of the first connection pin H101. When the link to a PCIe card is successful (Operation S16a, YES), the inserted memory card may be detected as a PCIe card and the link may be completed. On the other hand, when the link to a PCIe card fails (Operation S16a, NO), the inserted memory card may be detected as a micro SD card and the card detection process may be terminated (Operation S18).

Although an example in which the electronic system 1000 may detect the micro SD card, the UFS card, and the PCIe card is described above, the electronic system 1000 may be configured to detect only two cards among the micro SD card, the UFS card, and the PCIe card.

For example, as in the example embodiment shown in FIG. 4, when the voltage of the first connection pin H101 is low, the inserted memory card may be detected as a UFS card. However, when the first connection pin H101 is in a floating state, the inserted memory may be detected as a micro SD card, and the card detection process may be terminated. In this case, the electronic system 1000 may detect the UFS card and the micro SD card, and not detect the PCIe card.

In another example embodiment, when the voltage of the first connection pin H101 is low, the card detector 1013 may detect the inserted memory card as a UFS card. However, when the first connection pin H101 is in a floating state, a power source having the second voltage (e.g., about 1.2 volt) may be applied to the second connection pin H102, and when the voltage of the third connection pin H103 is lower than the second reference voltage, the inserted memory card may be detected as a PCIe card and the card detection process is completed. In this case, the electronic system 1000 may detect a UFS card and a PCIe card and not detect the micro SD card.

In some other example embodiments, when the first connection pin H101 is in a floating state, whether the voltage of the third connection pin H103 is lower than the second reference voltage may be immediately determined in this state.

Figure 6:
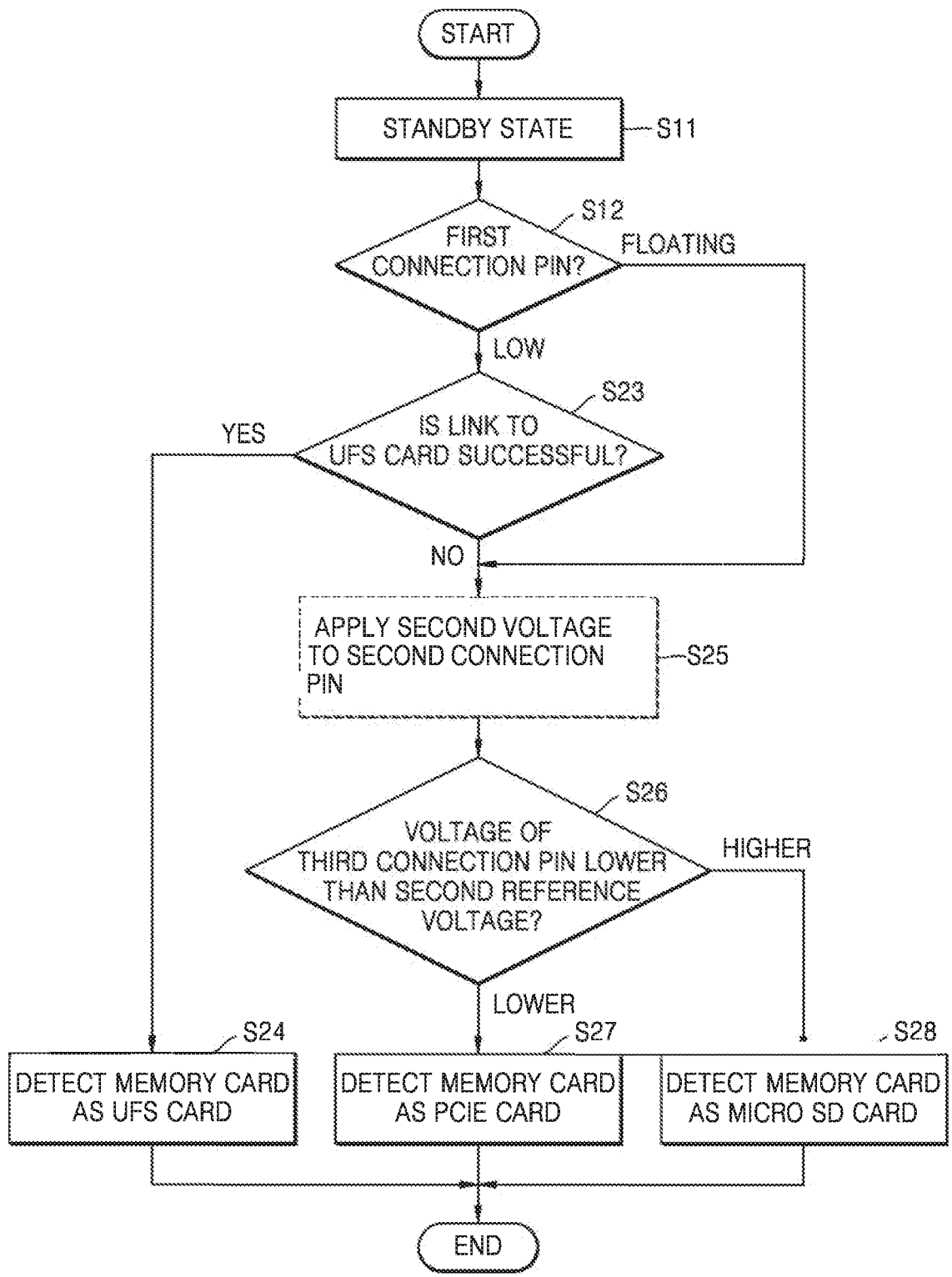

FIG. 6 is a flowchart illustrating a method by which the electronic system 1000 determines a type of memory card inserted in the card socket 1041, according to another example embodiment.

Referring to FIGS. 3 and 6, before a memory card is inserted, the card socket 1041 may be in a standby state (Operation S11).

When the voltage of the first connection pin H101 is lower than a first reference voltage (e.g., 1.65 volt), the card detector 1013 may determine that the voltage of the first connection pin H101 is low (Operation S12, LOW), attempt to link to the UFS card and determine whether a link to the UFS card is successful (Operation S23). When the memory card inserted in the card socket 1041 is detected as a UFS card and successfully linked (Operation S23, YES), the card detector 1013 may detect a memory card inserted in the card socket 1041 as a UFS card (Operation S24) and the card detection process may be terminated.

When the memory card inserted into the card socket 1041 fails to be detected as a UFS card, i.e., the link to the memory card fails (Operation S23, NO), the card detector 1013 determines whether the voltage of the third connection pin H103 is lower than a second reference voltage (e.g., 1.65 volt) (Operation S26). When the voltage of the third connection pin H103 is lower than the second reference voltage (e.g., 1.65 volt) (Operation S26, LOWER), the inserted memory card may be detected as a PCIe card (Operation S27), and when the voltage of the third connection pin H103 is higher than the second reference voltage (Operation S26, HIGHER), the inserted memory card may be detected as a micro SD card and the card detection process may be terminated (Operation S28). Optionally, in some example embodiments a power source having the second voltage (e.g., 1.2 volt) may be applied to the second connection pin H102 prior to determining whether the voltage of the third connection pin H103 is lower than the second reference voltage (e.g., 1.65 volt) (Operation S25).

When the first connection pin H101 is in a floating state (Operation S12, FLOATING), the card detector 1013 may determine whether the voltage of the third connection pin H103 is lower than the second reference voltage (e.g., 1.65 volt) (Operation S26). When the voltage of the third connection pin H103 is lower than the second reference voltage (Operation S26, LOWER), the card detector 1013 may detect the inserted memory card as a PCIe card (Operation S27). When the voltage of the third connecting pin H103 is higher than the second reference voltage (Operation S26, HIGHER), the inserted memory card may be detected as a micro SD card and the card detecting process may be terminated (Operation S28). Optionally, a power source having the second voltage (e.g., 1.2 volt) may be applied to the second connection pin H102 prior to determining whether the voltage of the third connection pin H103 is lower than the second reference voltage (e.g., 1.65 volt) (Operation S25).

Figure 7:
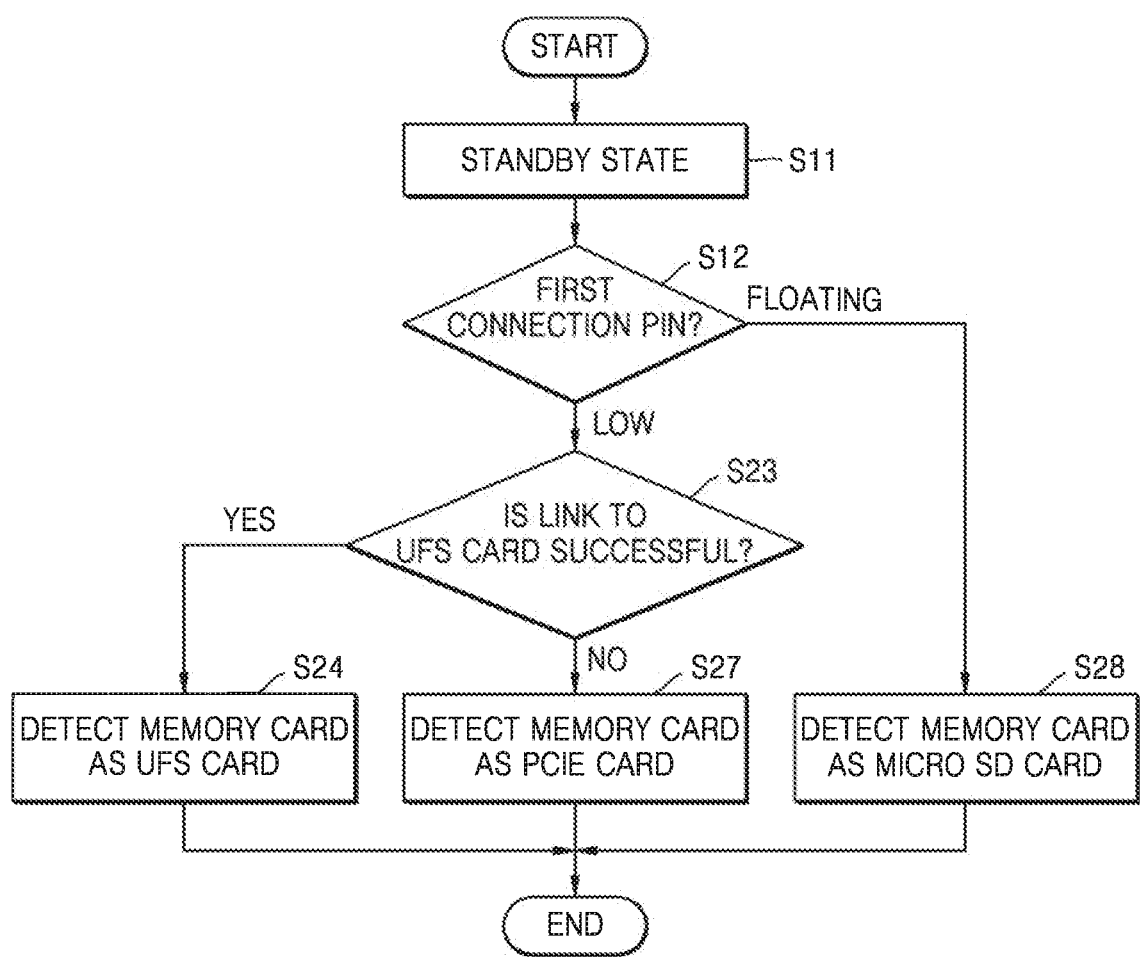

FIG. 7 is a flowchart illustrating a method by which the electronic system 1000 determines a type of memory card inserted in the card socket 1041, according to another example embodiment.

Referring to FIGS. 3 and 7, before a memory card is inserted, the card socket 1041 may be in a standby state (Operation S11).

When the voltage of the first connection pin H101 is lower than a first reference voltage (e.g., 1.65 volt), the card detector 1013 may determine that the voltage of the first connection pin H101 is low (Operation S12, LOW), and may attempt to link to the UFS card, and determine whether the link to the UFS card is successful (Operation S23). When the memory card inserted in the card socket 1041 is successfully linked (Operation S23, YES), the card detector 1013 may detect a memory card inserted in the card socket 1041 as a UFS card (Operation S24) and the card detection process may be terminated.

When the card detector 1013 fails to link to the memory card (Operation S23, NO), the card detector 1013 may detect the inserted memory card as a PCIe card (Operation S27) and terminate the card detection process.

When the first connection pin H101 is in a floating state (Operation S12, FLOATING), the card detector 1013 may detect the inserted memory as a micro SD card (Operation S28) and terminate the card detection process.

Although an example in which the electronic system 1000 may detect the micro SD card, the UFS card, and the PCIe card is described in the example embodiments of FIGS. 6 and 7, the electronic system 1000 may be configured to detect only two of the micro SD card, the UFS card, and the PCIe card.

For example, as in the example embodiment shown in FIG. 6, when the voltage of the first connection pin H101 is low, and the link to the UFS card is successful, the card detector 1013 may detect the memory card inserted in the card socket 1041 as a UFS card, and when the link to the memory card fails, the card detector 1013 may detect the memory card as a PCIe card. In this case, the electronic system 1000 may detect a UFS card and a PCIe card, and not detect the micro SD card.

In another example embodiment, when the voltage of the first connection pin H101 is low, the card detector 1013 may detect a memory card inserted in the card socket 1041 as a UFS card when the link to the inserted memory card is successful, and when the first connection pin H101 is in a floating state, the card detector 1013 may detect the inserted memory card as a micro SD card. In this case, the electronic system 1000 may detect a UFS card and a micro SD card, but not detect a PCIe card.

In some example embodiments, when the voltage of the third connection pin H103 is higher than the second reference voltage while the first connection pin H101 is in a floating state, the card detector 1013 may detect the inserted memory card as a micro SD card and link the inserted memory card to the card socket 1041. In some example embodiments, a power source having a second voltage (e.g., about 1.2 volt) may be applied to the second connection pin H102 prior to determining whether the voltage of the third connection pin H103 is higher than the second reference voltage.

Figure 8:
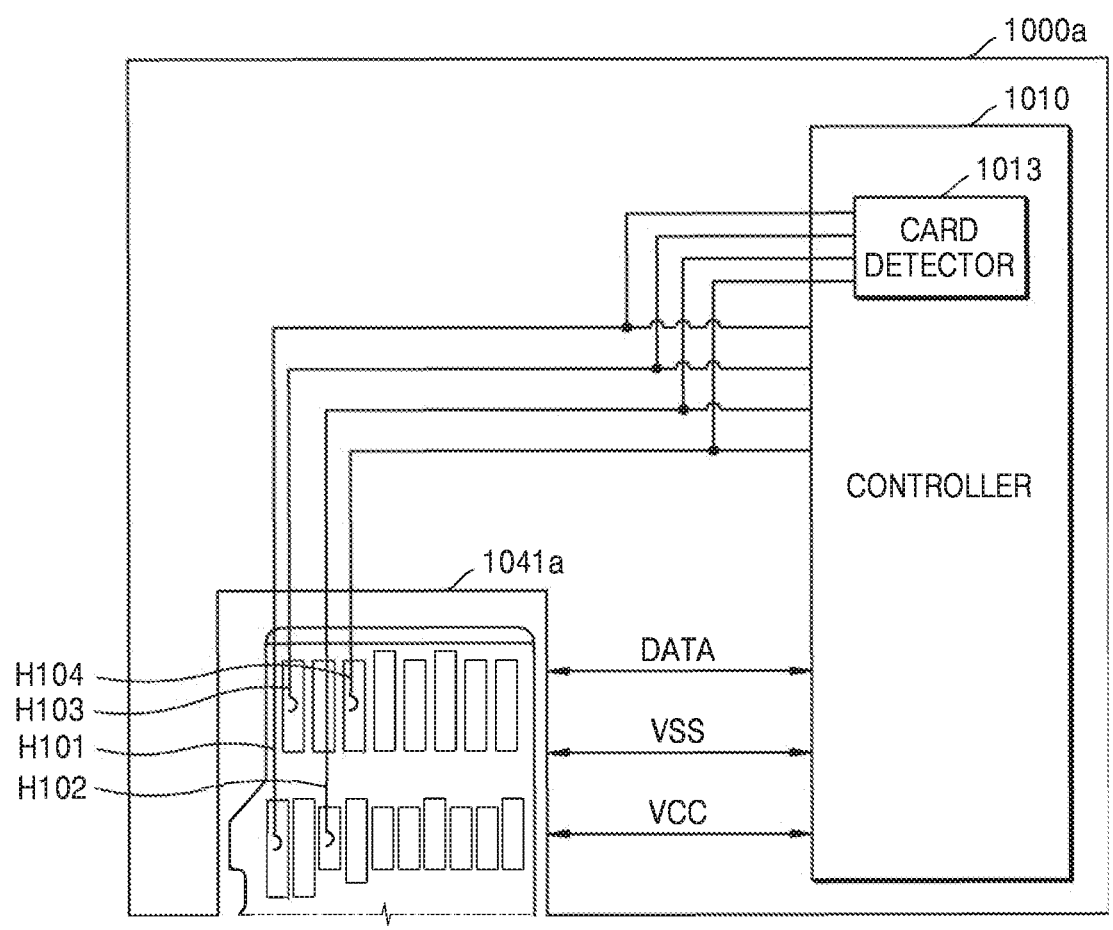
FIG. 8 is a conceptual diagram illustrating a portion of an electronic system according to another example embodiment.

FIG. 8 is a conceptual diagram illustrating a part of an electronic system 1000a according to another example embodiment.

The example embodiment shown in FIG. 8 is different from the example embodiment shown in FIG. 3 in that the electronic system 1000a further includes a fourth connection pin H104 compared to the electronic system 1000. Therefore, overlapping description will be omitted and the difference will be mainly described below.

A card socket 1041a may further include the fourth connection pin H104 connectable to a CMD terminal (see Table 1) of a micro SD card when the micro SD card is inserted. The fourth connection pin H104 may be directly connected to a card detector 1013 because the fourth connection pin H104 may be used for a card detection function.

In some example embodiments, the fourth connection pin H104 may be connected to a controller 1010 separately from the card detector 1013 because the fourth connection pin H104 may be further used for functions other than the card detection function in some cases. That is, in some example embodiments, the fourth connection pin H104 may be connected to the controller in addition to being connected to the card detector 1013 of the controller 1010.

Figure 9:
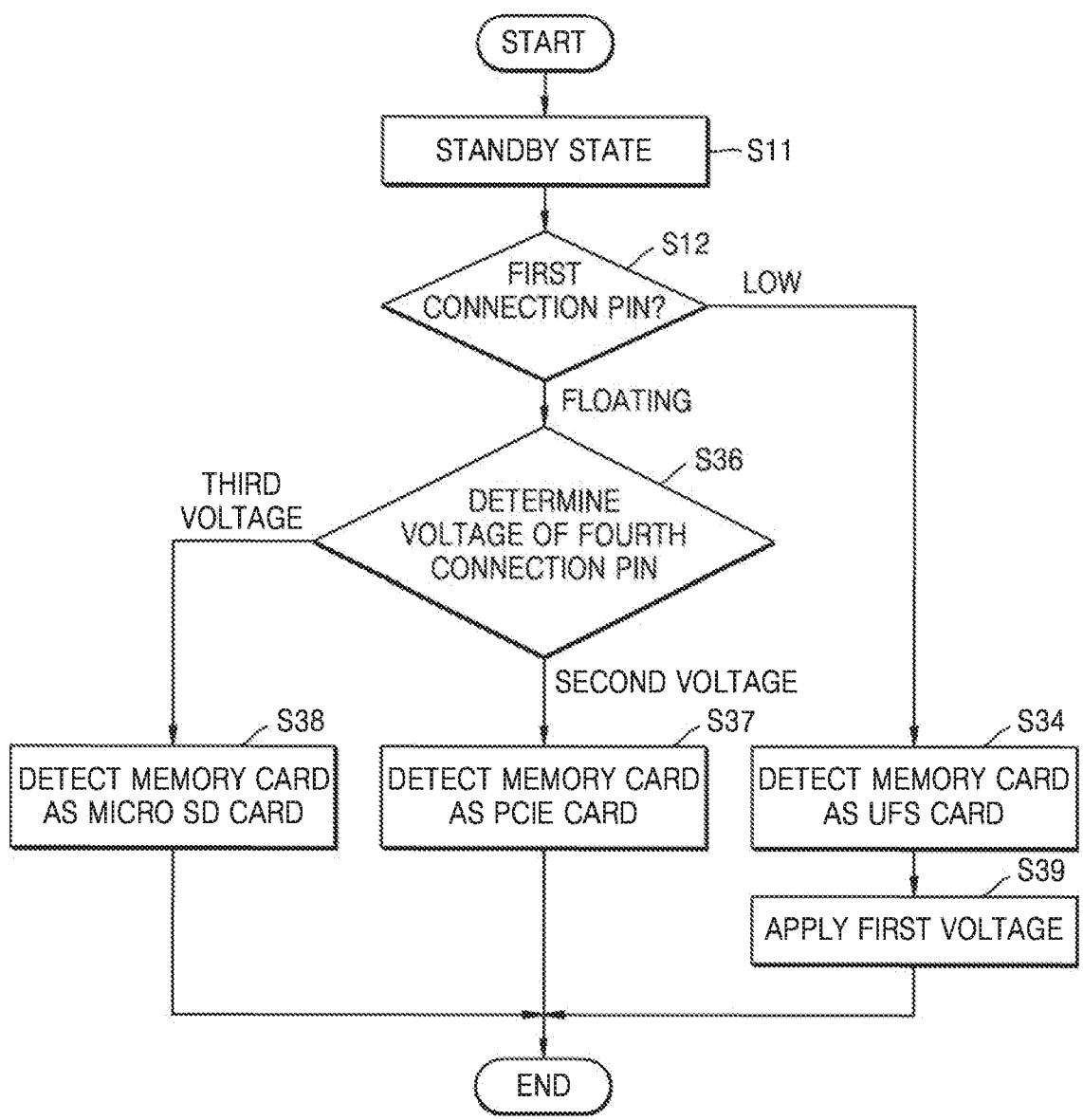
FIGS. 9 to 20 are flowcharts illustrating methods by which an electronic system determines a type of memory card inserted in a card socket, according to example embodiments.

FIG. 9 is a flowchart illustrating a method by which the electronic system 1000a determines a type of memory card inserted in the card socket 1041a, according to an example embodiment.

Referring to FIGS. 8 and 9, before a memory card is inserted, the card socket 1041a may be in a standby state (Operation S11). The standby state denotes that the card socket 1041a is empty.

The card detector 1013 may be connected to the first to fourth connection pins H101, H102, H103, and H104. When the voltage of the first connection pin H101 is lower than a first reference voltage (e.g., 1.65 volt), the card detector 1013 may determine that the voltage of the first connection pin H101 is low (Operation S12, LOW), and may detect a memory card inserted in the card socket 1041a as a UFS card (Operation S34). Since the memory card inserted in the card socket 1041a is detected as a UFS card, a power source having a first voltage (e.g., approximately 1.8 volt) may be applied to a power terminal of the UFS card (Operation S39), and a follow-up work may be performed.

When the first connection pin H101 is in a floating state (Operation S12, FLOATING), the voltage of the fourth connection pin H104 may be determined (Operation S36). When the voltage of the fourth connection pin H104 is approximately equal to a second voltage (e.g., about 1.2 volt) (Operation S36, SECOND VOLTAGE), the card detector 1013 may detect the inserted memory card as a PCIe card (Operation S37) and terminate the card detection process.

When the voltage of the fourth connection pin H104 is approximately equal to a third voltage (e.g., about 3.3 volt) (Operation S36, THIRD VOLTAGE), the card detector 1013 may detect the inserted memory card as a micro SD card (Operation S38) and terminate the card detection process.

Although an example in which the electronic system 1000a may detect the micro SD card, the UFS card, and the PCIe card is described in the example embodiment of FIG. 9, the electronic system 1000a may detect only two of the micro SD card, the UFS card, and the PCIe card.

For example, as in the example embodiment shown in FIG. 9, when the voltage of the first connection pin H101 is low, the inserted memory card may be detected as a UFS card, and when the first connection pin H101 is in a floating state, the voltage of the fourth connection pin H104 may be measured, and in this case, if the measured voltage of the fourth connection pin H104 is approximately equal to the second voltage, the inserted memory card may be detected as a PCIe card and the card detection process may be terminated.

In another example embodiment, as in the example embodiment shown in FIG. 9, when the voltage of the first connection pin H101 is low, the inserted memory card may be detected as a UFS card, and when the first connection pin H101 is in a floating state, the voltage of the fourth connection pin H104 may be measured, and in this case, if the measured voltage of the fourth connection pin H104 is approximately equal to the third voltage, the inserted memory card may be detected as a micro SD card and the card detection process may be terminated.

Figure 10A:
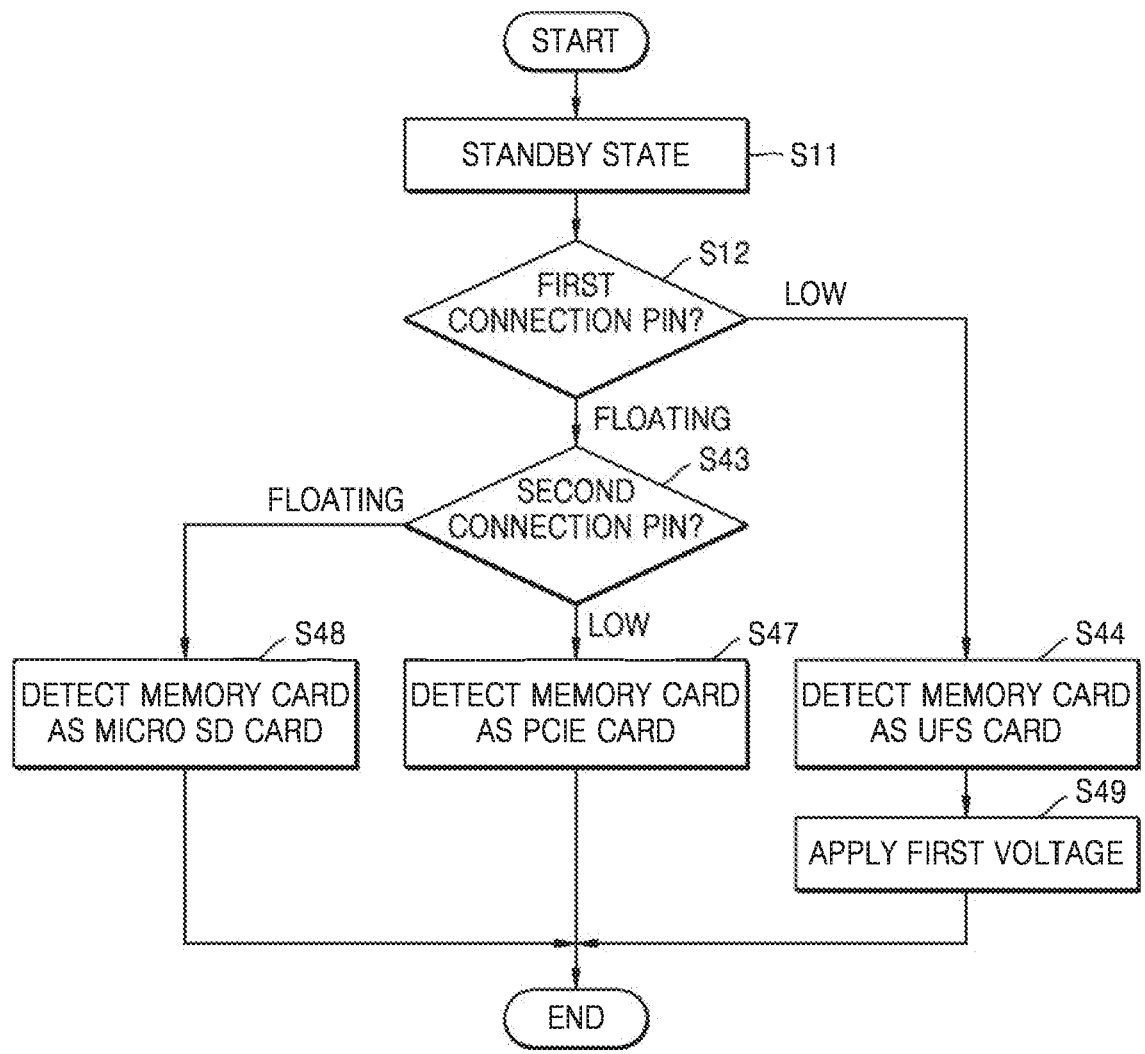

FIG. 10A is a flowchart illustrating a method by which the electronic system 1000a determines a type of memory card inserted in the card socket 1041a, according to another example embodiment.

Referring to FIGS. 8 and 10A, before a memory card is inserted, the card socket 1041a may be in a standby state (Operation S11). The standby state denotes that the card socket 1041a is empty.

The card detector 1013 may be connected to the first to fourth connection pins H101, H102, H103, and H104. When the voltage of the first connection pin H101 is lower than a first reference voltage (e.g., 1.65 volt), the card detector 1013 may determine that the voltage of the first connection pin H101 is low (Operation S12, LOW), and may detect a memory card inserted in the card socket 1041a as a UFS card (Operation S44). Since the memory card inserted in the card socket 1041a is detected as a UFS card, a power source having a first voltage (e.g., approximately 1.8 volt) may be applied to a power terminal (i.e., the VCCQ2 terminal of Table 2) of the UFS card (Operation S49) and a follow-up work may be performed.

When the first connection pin H101 is in a floating state (Operation S12, FLOATING) and the voltage of the second connection pin H102 is lower than a third reference voltage (e.g., 1.65 volt), the card detector 1013 may determine that the voltage of the second connection pin H102 is low (Operation S43, LOW), and may detect the memory card inserted in the card socket 1041a as a PCIe card (Operation S47) and terminate the card detection process.

Otherwise, when both the first connection pin H101 and the second connection pin H102 are in a floating state (Operation S43, FLOATING), the memory card inserted in the card socket 1041a may be detected as a micro SD card (Operation S48) and the card detection process may be terminated.

Figure 10B:
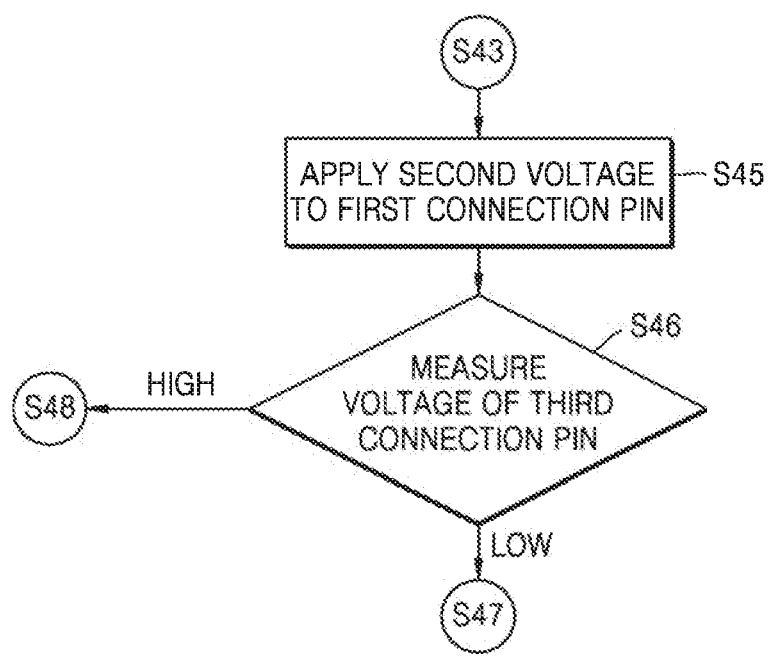

FIG. 10B is a flowchart illustrating a process of determining and recognizing an inserted memory card as a PCIe card when the voltage of the second connection pin H102 is low in the method of FIG. 10A.

Referring to FIGS. 9, 10A and 10B, when the voltage of the second connection pin H102 is low (Operation S43, LOW), the second voltage may be applied to the first connection pin H101 (Operation S45) and the voltage of the third connection pin H103 may be measured (Operation S46). When the measured voltage of the third connection pin H103 is lower than the second reference voltage, i.e., when the measured voltage of the third connection pin H103 is low (Operation S46, LOW), the inserted memory card may be detected as a PCIe card (Operation S47). On the other hand, when the measured potential of the third connection pin H103 is higher than the second reference voltage, i.e., is high (Operation S48, HIGH), the inserted memory card may be detected as a micro SD card (Operation S48).

Although an example in which the electronic system 1000a may detect the micro SD card, the UFS card, and the PCIe card is described in the example embodiments of FIGS. 10A and 10B, the electronic system 1000a may detect only two of the micro SD card, the UFS card, and the PCIe card.

For example, as in the example embodiments shown in FIGS. 10A and 10B, when the voltage of the first connection pin H101 is low, the card detector 1013 may detect a memory card inserted in the card socket 1041a as a UFS card and link the memory card to the card socket 1041a. In addition, when the first connection pin H101 is in a floating state and the voltage of the second connection pin H102 is lower than the third reference voltage (e.g., 1.65 volt), the card detector 1013 may detect the inserted memory card as a PCIe card and terminate the card detection process. In this case, the electronic system 1000*a* may detect a UFS card and a PCIe card, and not detect a micro SD card.

In another example embodiment, when the voltage of the first connection pin H101 is low, the card detector 1013 may detect a memory card inserted in the card socket 1041*a* as a UFS card and link the memory card to the card socket 1041*a*. On the other hand, when the first connection pin H101 is in a floating state, the card detector 1013 may detect the inserted memory card as a micro SD card and terminate the card detection process. In this case, the electronic system 1000*a* may detect a UFS card and a micro SD card, and not detect a PCIe card.

Figure 11:
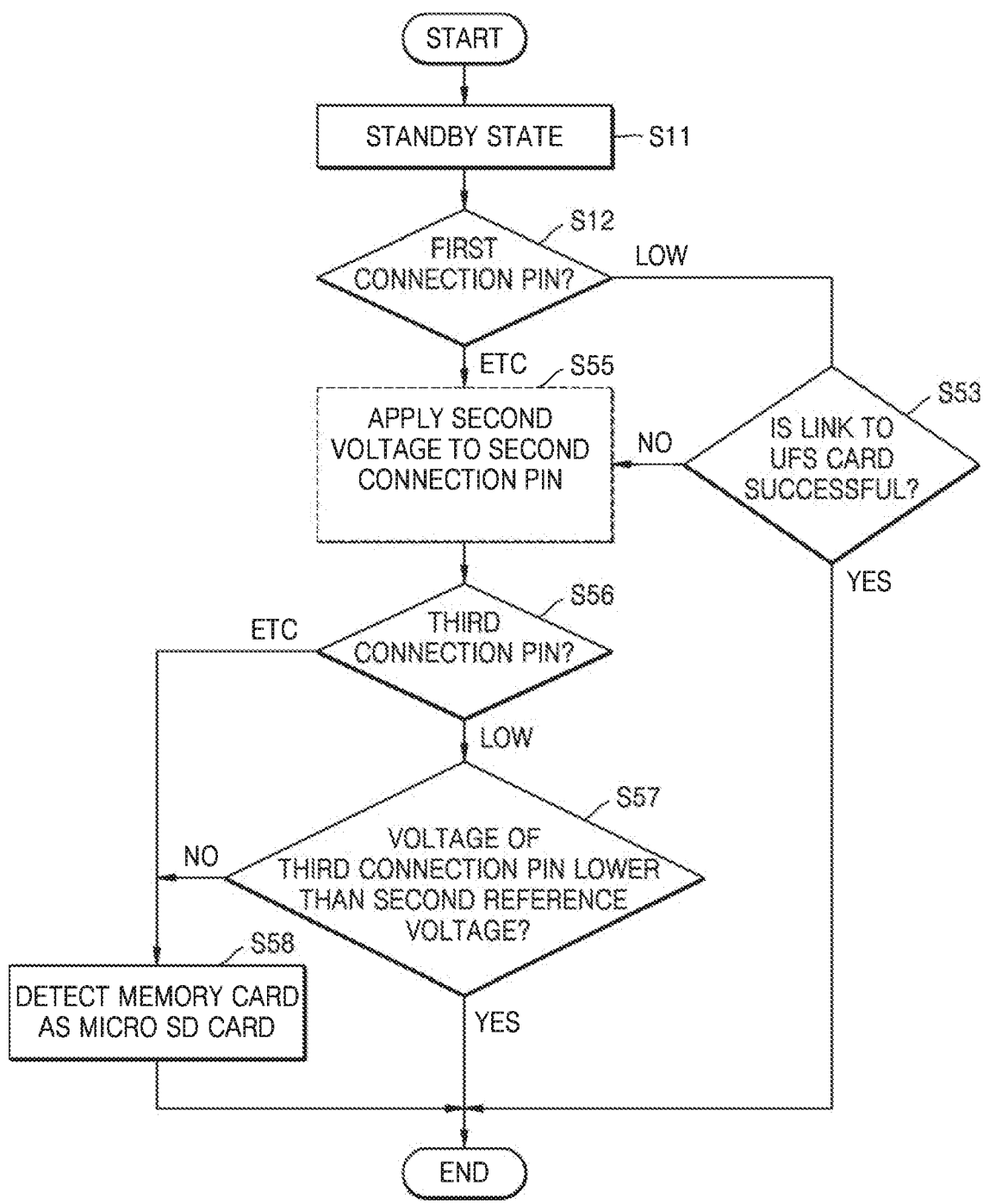

FIG. 11 is a flowchart illustrating a method by which the electronic system 1000*a* determines a type of memory card inserted in the card socket 1041*a*, according to another example embodiment.

Referring to FIGS. 8 and 11, before a memory card is inserted, the card socket 1041*a* may be in a standby state (Operation S11).

The card detector 1013 may be connected to the first to fourth connection pins H101, H102, H103, and H104. When the voltage of the first connection pin H101 is lower than a first reference voltage (e.g., 1.65 volt), the card detector 1013 may determine that the voltage of the first connection pin H101 is low (Operation S12, LOW), and may detect a memory card inserted in the card socket 1041*a* as a UFS card and determine whether a link to the UFS card is successful (Operation S53). As a result, when a UFS link between the electronic system 1000*a* and the inserted memory card is successful (Operation S53, YES), a follow-up work may be performed.

When the voltage of the first connection pin H101 is not low (Operation S12, ETC) or when a link to a UFS card fails although the voltage of the first connection pin H101 is low (Operation S53, NO), the card detector 1013 may determine whether the voltage of the third connection pin H103 is lower than a second reference voltage (e.g., 1.65 volt) (Operation S56). When the voltage of the third connection pin H103 is lower than the second reference voltage (e.g., 1.65 volt), the card detector 1013 may determine that the voltage of the third connection pin H103 is low (Operation S53, LOW) and may detect a memory card inserted in the card socket 1041*a* as a PCIe card and determine whether a link to the PCIe card is successful (Operation S57). As a result, when a PCIe link between the electronic system 1000*a* and the inserted memory card is successful (Operation S57, YES), a follow-up work may be performed.

When the voltage of the third connection pin H103 is not low (Operation S56, ETC) or when a link to a PCIe card fails although the voltage of the third connection pin H103 is low (Operation S57, NO), the card detector 1013 may detect the inserted memory card as a micro SD card (Operation S58).

In some example embodiments, a second voltage (e.g., about 1.2 volt) may be applied to the second connection pin H102 prior to determining whether the voltage of the third connection pin H103 is lower than the second reference voltage (e.g., 1.65 volt) (Operation S55).

Although an example in which the electronic system 1000*a* may detect the micro SD card, the UFS card, and the PCIe card is described in the example embodiment of FIG. 11, the electronic system 1000*a* may detect only two of the micro SD card, the UFS card, and the PCIe card.

For example, as in the example embodiment shown in FIG. 11, when the voltage of the first connection pin H101 is low, the card detector 1013 may detect a memory card inserted in the card socket 1041*a* as a UFS card and link the memory card to the card socket 1041*a*. As a result, when a UFS link between the electronic system 1000*a* and the inserted memory card is successful, a follow-up work may be performed.

When the voltage of the first connection pin H101 is not low ("ETC") or when a link to a UFS card fails although the voltage of the first connection pin H101 is low, the second voltage may be selectively applied to the second connection pin H102, as described above (Operation S55), and, when the voltage of the third connection pin H103 is lower than the second reference voltage, the card detector 1013 may detect a memory card inserted in the card socket 1041*a* as a PCIe card. In this case, the electronic system 1000*a* may detect a UFS card and a PCIe card.

In another example embodiment, when the voltage of the first connection pin H101 is low, the card detector 1013 may detect a memory card inserted in the card socket 1041*a* as a UFS card and link the memory card to the card socket 1041*a*. As a result, when a UFS link between the electronic system 1000*a* and the inserted memory card is successful, a follow-up work may be performed.

On the other hand, when the first connection pin H101 is not low and when the voltage of the third connection pin H103 is not low (Operation S56, ETC), the inserted memory card may be detected as a micro SD card and the card detection process may be terminated. In this case, the electronic system 1000*a* may detect the UFS card and the micro SD card, and not detect the PCIe card.

Figure 12:
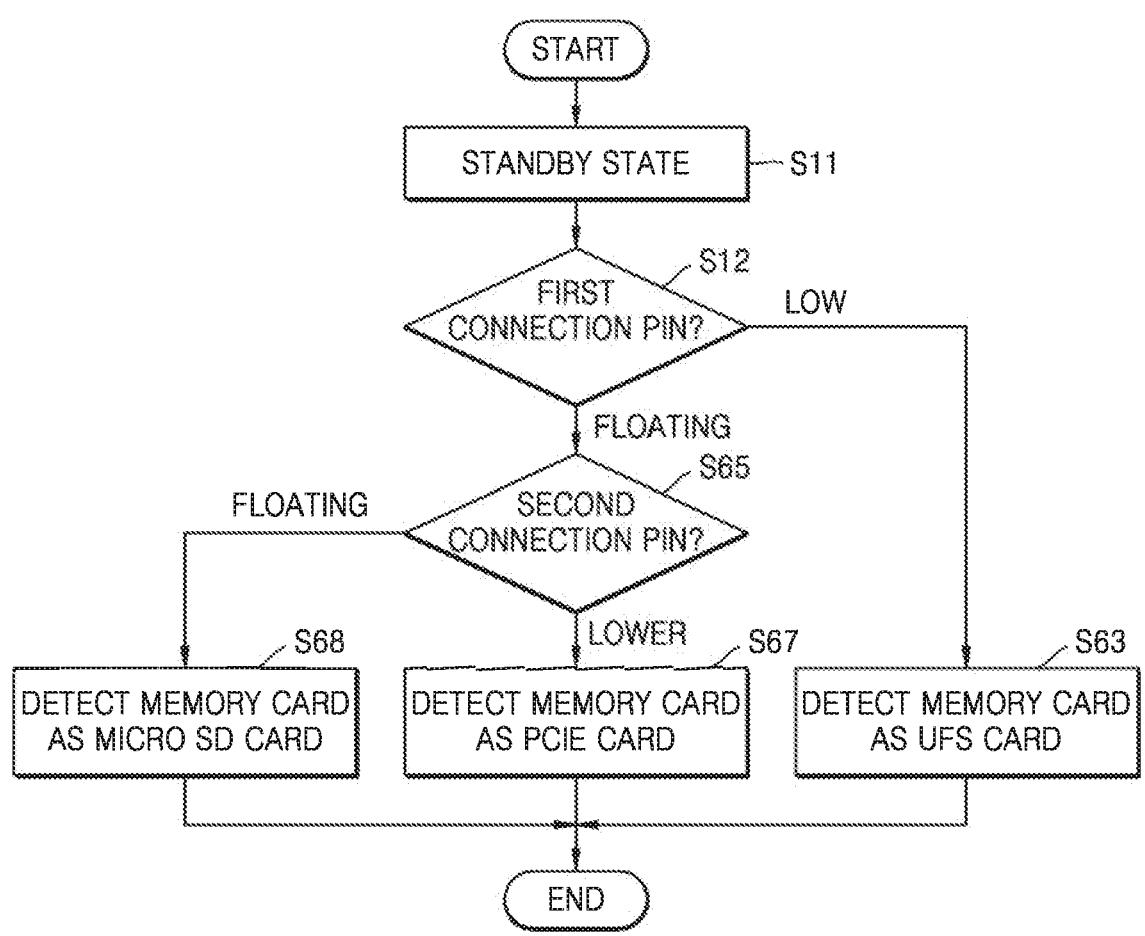

FIG. 12 is a flowchart illustrating a method by which the electronic system 1000*a* determines a type of memory card inserted in the card socket 1041*a*, according to another example embodiment.

Referring to FIGS. 8 and 12, before a memory card is inserted, the card socket 1041*a* may be in a standby state (Operation S11).

When the voltage of the first connection pin H101 is lower than a first reference voltage (e.g., 1.65 volt) when a memory card is inserted, the card detector 1013 may determine that the voltage of the first connection pin H101 is low (Operation S12, LOW), and may detect the memory card inserted in the card socket 1041*a* as a UFS card (Operation S63).

When the first connection pin H101 is in a floating state (Operation S12, FLOATING), the voltage of the second connection pin H102 may be measured (Operation S65). When the measured voltage of the second connection pin H102 is lower than a third reference voltage (e.g., about 1.65 volt) (Operation S65, LOWER), the card detector 1013 may detect the memory card inserted in the card socket 1041*a* as a PCIe card (Operation S67).

When the second connection pin H102 is in a floating state (Operation S65, FLOATING), the card detector 1013 may detect a memory card inserted in the card socket 1041*a* as a micro SD card (Operation S68). In some example embodiments, the card detector 1013 may check whether the voltage of the fourth connection pin H104 is approximately a third voltage (e.g., about 3.3 volt) before linking an inserted memory card as a micro SD card after it is confirmed that the second connection pin H102 is in a floating state.

Although an example in which the electronic system 1000*a* may detect the micro SD card, the UFS card, and the PCIe card is described in the example embodiment of FIG. 12, the electronic system 1000*a* may detect only two of the micro SD card, the UFS card, and the PCIe card.

For example, as in the example embodiment shown in FIG. 12, when the voltage of the first connection pin H101 is low, the card detector 1013 may detect an inserted memory card as a UFS card. When the first connection pin H101 is in a floating state, the card detector 1013 may check whether the voltage of the second connection pin H102 is low, and when the voltage of the second connection pin H102 is low, the card detector 1013 may apply a second voltage (for example, about 1.2 volt) to the first connection pin H101 to detect a memory card inserted in the card socket 1041*a* as a PCIe card. In this case, the electronic system 1000*a* may detect a UFS card and a PCIe card, and not detect a micro SD card.

In another example embodiment, as in the example embodiment shown in FIG. 12, when the voltage of the first connection pin H101 is low, the card detector 1013 may detect an inserted memory card as a UFS card. On the other hand, when the first connection pin H101 is in a floating state, the card detector 1013 may check whether the voltage of the second connection pin H102 is approximately a third voltage (e.g., about 3.3 volt) and then may detect a memory card inserted in the card socket 1041*a* as a micro SD card based on the voltage of the second connection pin H102 as described above. In this case, the electronic system 1000*a* may detect a UFS card and a micro SD card, and not detect a PCIe card.

Figure 13:
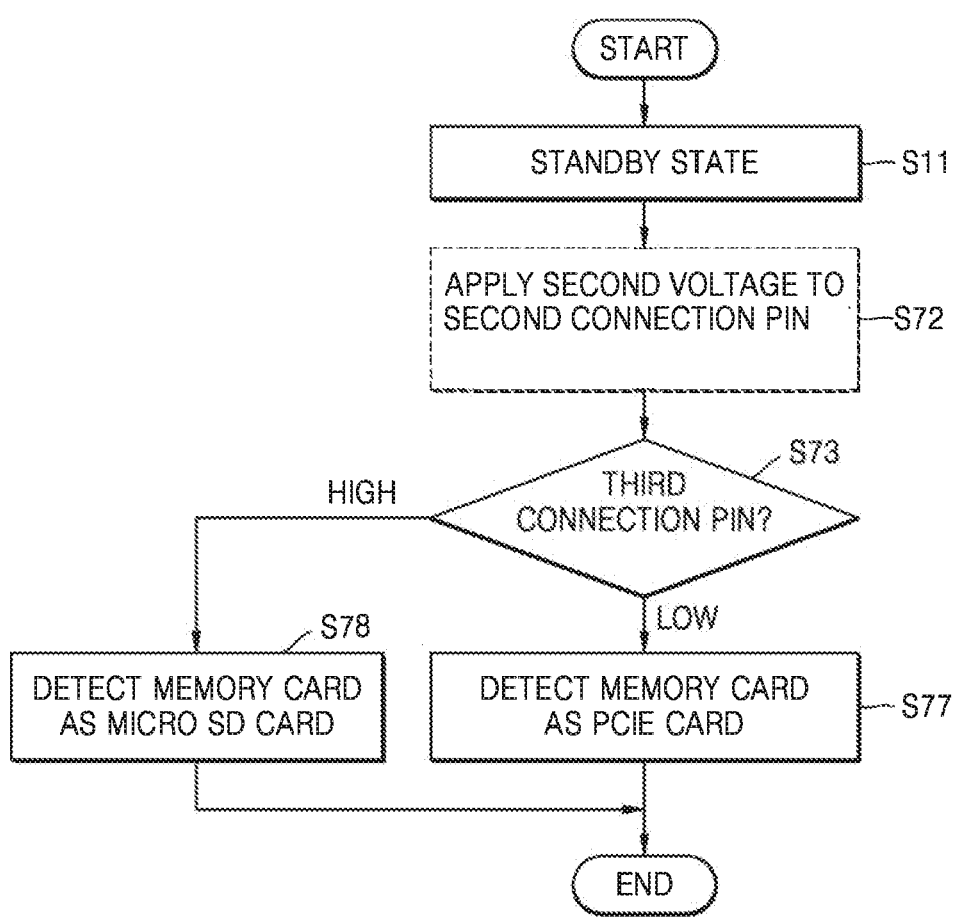

FIG. 13 is a flowchart illustrating a method by which the electronic system 1000*a* determines a type of memory card inserted in the card socket 1041*a*, according to another example embodiment.

Referring to FIGS. 8 and 13, before a memory card is inserted, the card socket 1041*a* may be in a standby state (Operation S11).

When a memory card is inserted, the first connection pin H101 may be in a floating state. When the voltage of the third connection pin H103 is lower than a second reference voltage (e.g., 1.65 volt), the card detector 1013 may determine that the voltage of the third connection pin H103 is low (Operation S73, LOW), and may detect the memory card inserted in the card socket 1041*a* as a PCIe card (Operation S77). In some example embodiments, a second voltage (e.g., about 1.2 volt) may be applied to the second connection pin H102 (Operation S72) prior to determining whether the voltage of the third connection pin H103 is lower than the second reference voltage (e.g., 1.65 volt).

When the voltage of the third connection pin H103 is higher than the second reference voltage, the card detector 1013 may determine that the voltage of the third connection pin H103 is a high level (Operation S73, HIGH), and may detect the memory card inserted in the card socket 1041*a* as a micro SD card (Operation S78).

Figure 14:
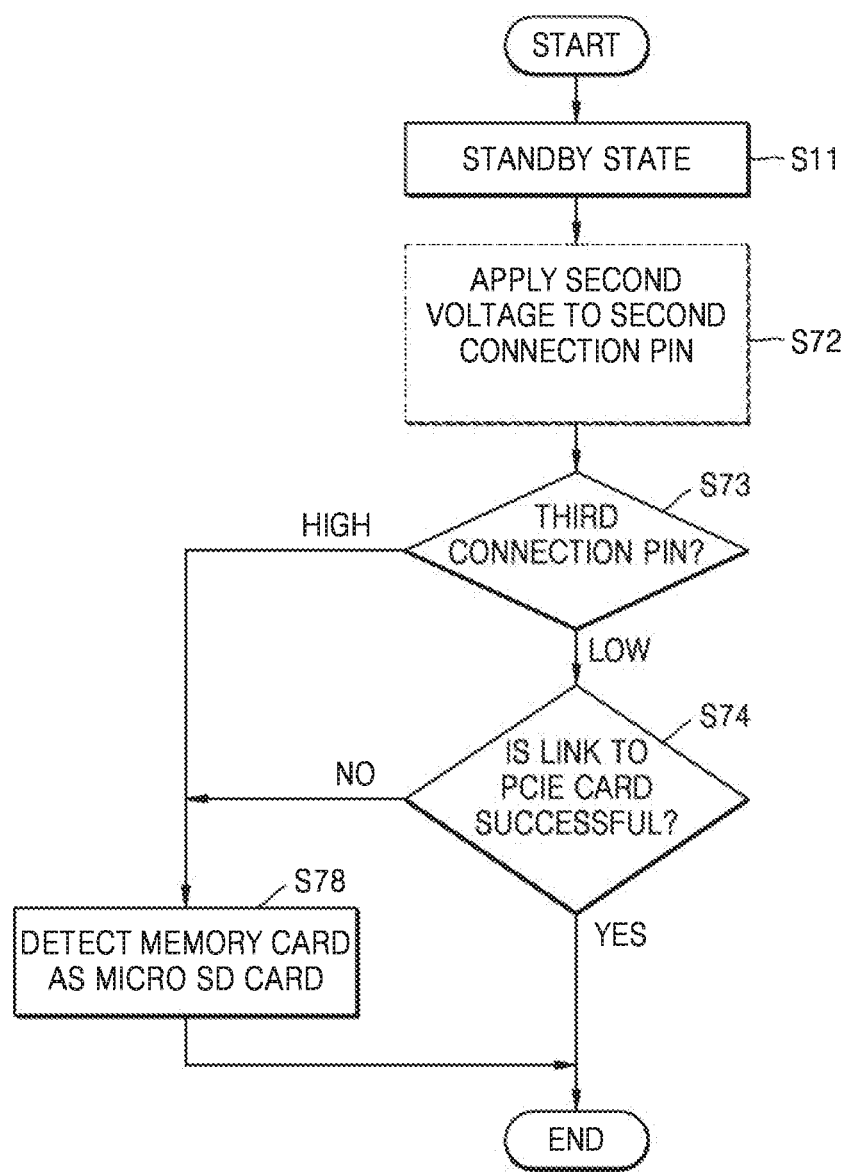

FIG. 14 is a flowchart illustrating a method by which the electronic system 1000*a* determines a type of memory card inserted in the card socket 1041*a*, according to another example embodiment.

Referring to FIGS. 8 and 14, before a memory card is inserted, the card socket 1041*a* may be in a standby state (Operation S11).

When a memory card is inserted, the first connection pin H101 may be in a floating state. When the voltage of the third connection pin H103 is lower than a second reference voltage (e.g., 1.65 volt), the card detector 1013 may determine that the voltage of the third connection pin H103 is low (Operation S73, LOW), and may attempt a link to detect a memory card inserted in the card socket 1041*a* as a PCIe card (Operation S74). As a result, when a PCIe link between the electronic system 1000*a* and the inserted memory card is successful (Operation S74, YES), a follow-up work may be performed. In some example embodiments, a second voltage (e.g., about 1.2 volt) may be applied to the second connection pin H102 (Operation S72) prior to determining whether the voltage of the third connection pin H103 is lower than the second reference voltage (e.g., 1.65 volt).

When the voltage of the third connection pin H103 is not low (Operation S73, HIGH) or when a link to an assumed PCIe card fails although the voltage of the third connection pin H103 is low (Operation S74, NO), the card detector 1013 may detect the inserted memory card as a micro SD card (Operation S78).

Figure 15:
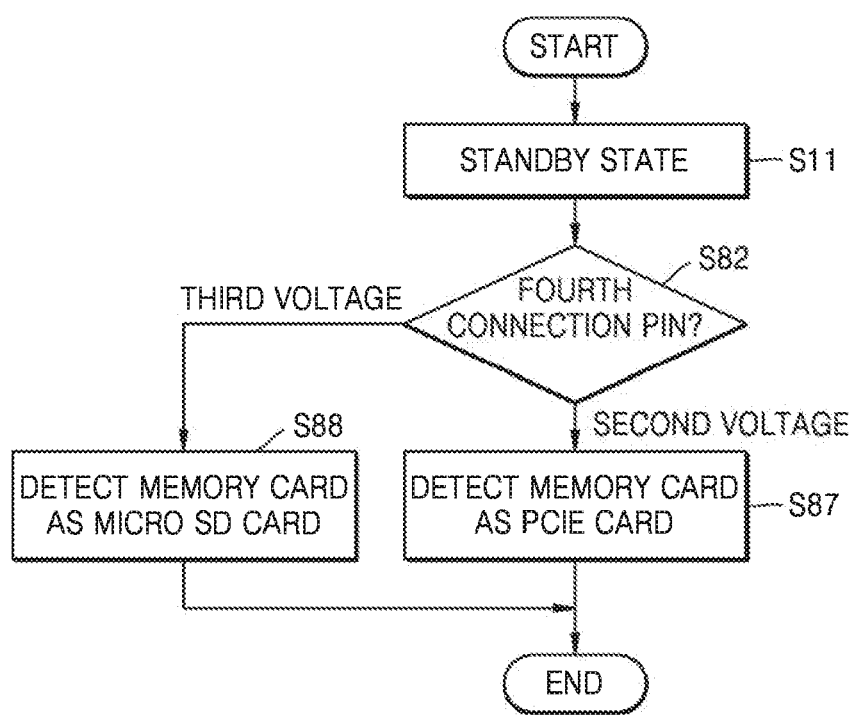

FIG. 15 is a flowchart illustrating a method by which the electronic system 1000*a* determines a type of memory card inserted in the card socket 1041*a*, according to another example embodiment.

Referring to FIGS. 8 and 15, before a memory card is inserted, the card socket 1041*a* may be in a standby state (Operation S11).

When a memory card is inserted, the first connection pin H101 may be in a floating state. When the voltage of the fourth connection pin H104 is approximately a second voltage (e.g., about 1.2 volt) (Operation S82, SECOND VOLTAGE), the card detector 1013 may supply a power source having the second voltage to the second connection pin H102 and detect an inserted memory card as a PCIe card (Operation S87).

When the voltage of the fourth connection pin H104 is approximately a third voltage (e.g., about 3.3 volt) (Operation S82, THIRD VOLTAGE), the card detector 1013 may detect an inserted memory card as a micro SD card (Operation S88).

Figure 16:
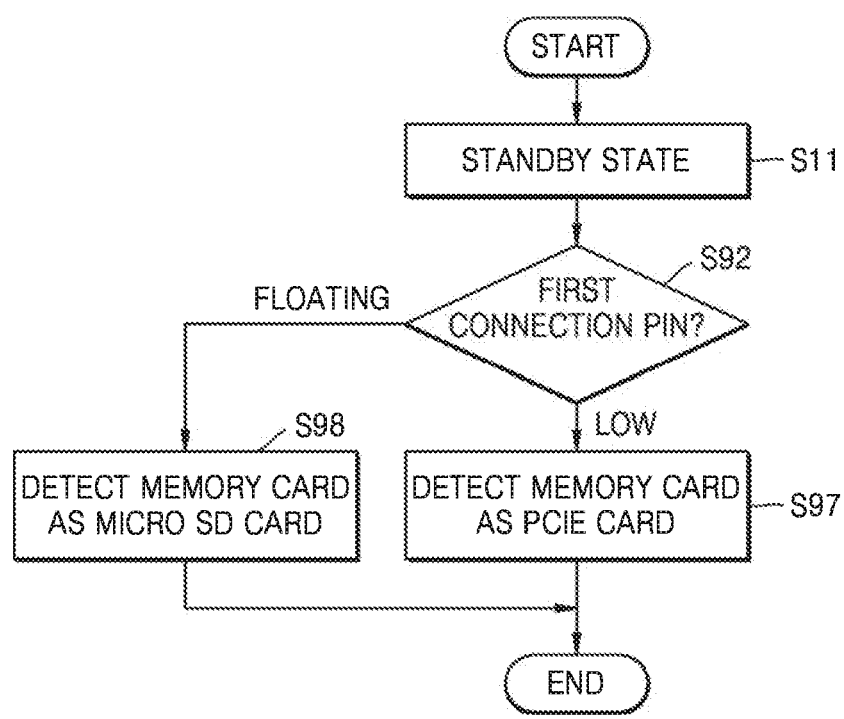

FIG. 16 is a flowchart illustrating a method by which the electronic system 1000*a* determines a type of memory card inserted in the card socket 1041*a*, according to another example embodiment.

Referring to FIGS. 8 and 16, before a memory card is inserted, the card socket 1041*a* may be in a standby state (Operation S11).

When the voltage of the first connection pin H101 is lower than a first reference voltage when a memory card is inserted (Operation S92, LOW), the card detector 1013 may supply a power source having a second voltage to the second connection pin H102 and detect an inserted memory card as a PCIe card (Operation S97).

When the first connection pin H101 is in a floating state (Operation S92, FLOATING), the card detector 1013 may detect an inserted memory card as a micro SD card (Operation S98).

Figure 17:
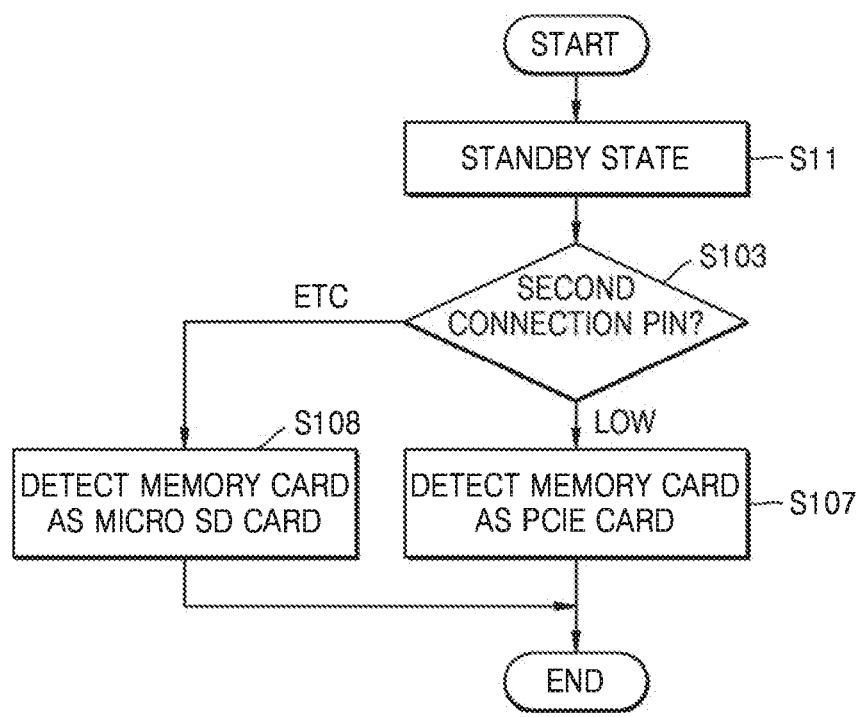

FIG. 17 is a flowchart illustrating a method by which the electronic system 1000*a* determines the type of memory card inserted in the card socket 1041*a*, according to another example embodiment.

Referring to FIGS. 8 and 17, before a memory card is inserted, the card socket 1041*a* may be in a standby state (Operation S11).

When a memory card is inserted, the first connection pin H101 may be in a floating state. When the voltage of the second connection pin H102 is lower than a third reference voltage (e.g., 1.65 volt), the card detector 1013 may determine that the voltage of the second connection pin H102 is low (Operation S103, LOW), and may detect a memory card inserted in the card socket 1041*a* as a PCIe card (Operation S107).

When the voltage of the second connection pin H102 is not low (Operation S103, ETC), the card detector 1013 may detect a memory card inserted in the card socket 1041*a* as a micro SD card (S108). In some example embodiments, when the voltage of the second connection pin H102 is not low and the voltage of the fourth connection pin H104 is a third voltage (e.g., about 3.3 volt), the card detector 1013 may detect a memory card inserted in the card socket 1041a as a micro SD card.

Figure 18:
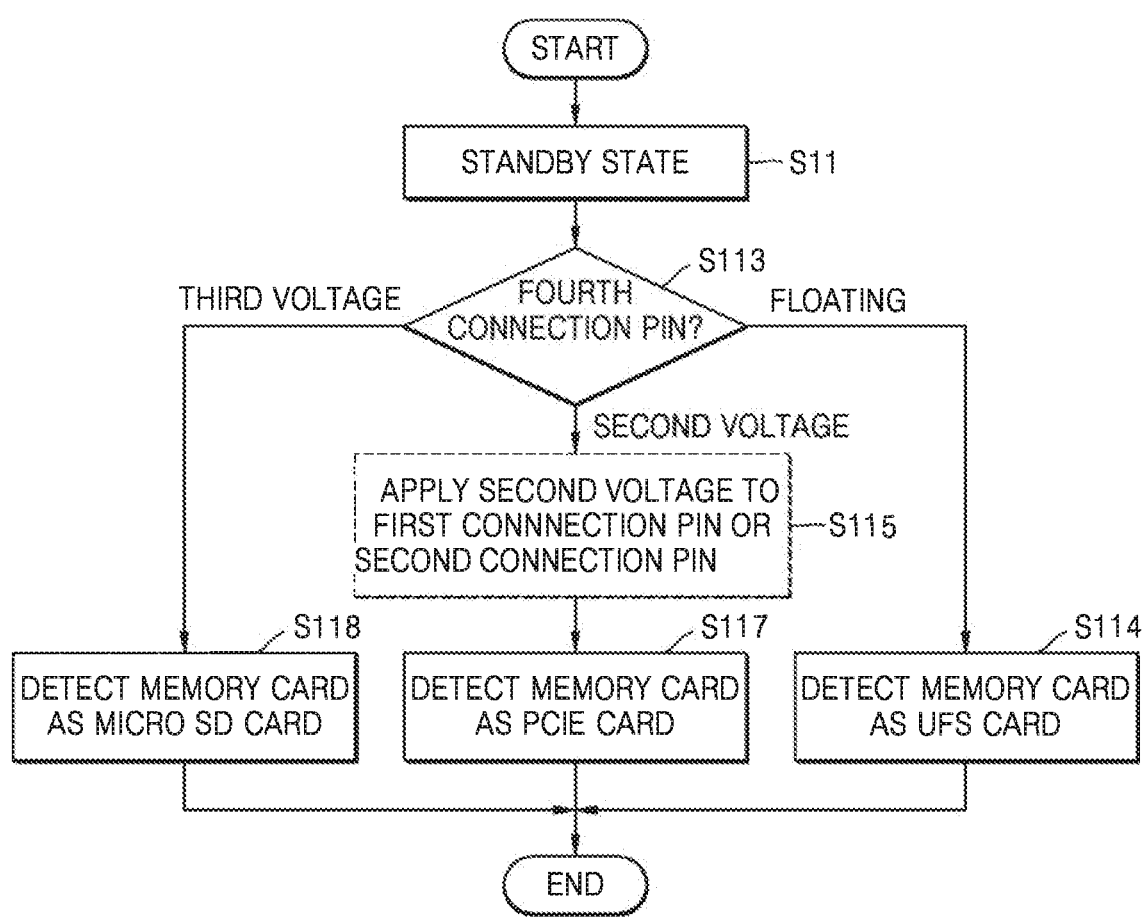

FIG. 18 is a flowchart illustrating a method by which the electronic system 1000a determines a type of memory card inserted in the card socket 1041a, according to another example embodiment.

Referring to FIGS. 8 and 18, before a memory card is inserted, the card socket 1041a may be in a standby state (Operation S11).

When the voltage of the fourth connection pin H104 is a third voltage when a memory card is inserted (Operation S113, THIRD VOLTAGE), the card detector 1013 may detect the inserted memory card as a micro SD card (Operation S118).

When the voltage of the fourth connection pin H104 is a second voltage (Operation S113, SECOND VOLTAGE), the card detector 1013 may detect the inserted memory card as a PCIe card (Operation S117). The second voltage may be applied to the first connection pin H101 or the second connection pin H102 before the card detector 1013 attempts to detect the memory card inserted in the card socket 1041a as a PCIe card (Operation S115).

When the fourth connection pin H104 is in a floating state (Operation S113, FLOATING), the card detector 1013 may supply a power source (e.g., about 1.8 volt) to the memory card inserted in the card socket 1041a and detect the inserted memory card as a UFS card (Operation S114).

Although an example in which the electronic system 1000a may detect the micro SD card, the UFS card, and the PCIe card is described in the example embodiment of FIG. 18, the electronic system 1000a may detect only two of the micro SD card, the UFS card, and the PCIe card.

For example, as in the example embodiment shown in FIG. 18, when the voltage of the fourth connection pin H104 is a third voltage when a memory card is inserted, the card detector 1013 may detect the inserted memory card as a micro SD card. When the fourth connection pin H104 is in a floating state, the card detector 1013 may detect the inserted memory card as a UFS card.

In another example embodiment, when the voltage of the fourth connection pin H104 is a third voltage when a memory card is inserted, the card detector 1013 may detect the inserted memory card as a micro SD card. When the voltage of the fourth connection pin H104 is the second voltage (Operation S113, SECOND VOLTAGE), the card detector 1013 may detect the inserted memory card as a PCIe card. In some example embodiments, the second voltage may be applied to the first connection pin H101 or the second connection pin H102 before the card detector 1013 attempts to detect a memory card inserted in the card socket 1041a as a PCIe card.

In another example embodiment, when the voltage of the fourth connection pin H104 is the second voltage (Operation S113, SECOND VOLTAGE), the card detector 1013 may detect a memory card inserted in the card socket 1041a as a PCIe card. When the fourth connection pin H104 is in a floating state, the card detector 1013 may detect the inserted memory card as a UFS card.

Figure 19:
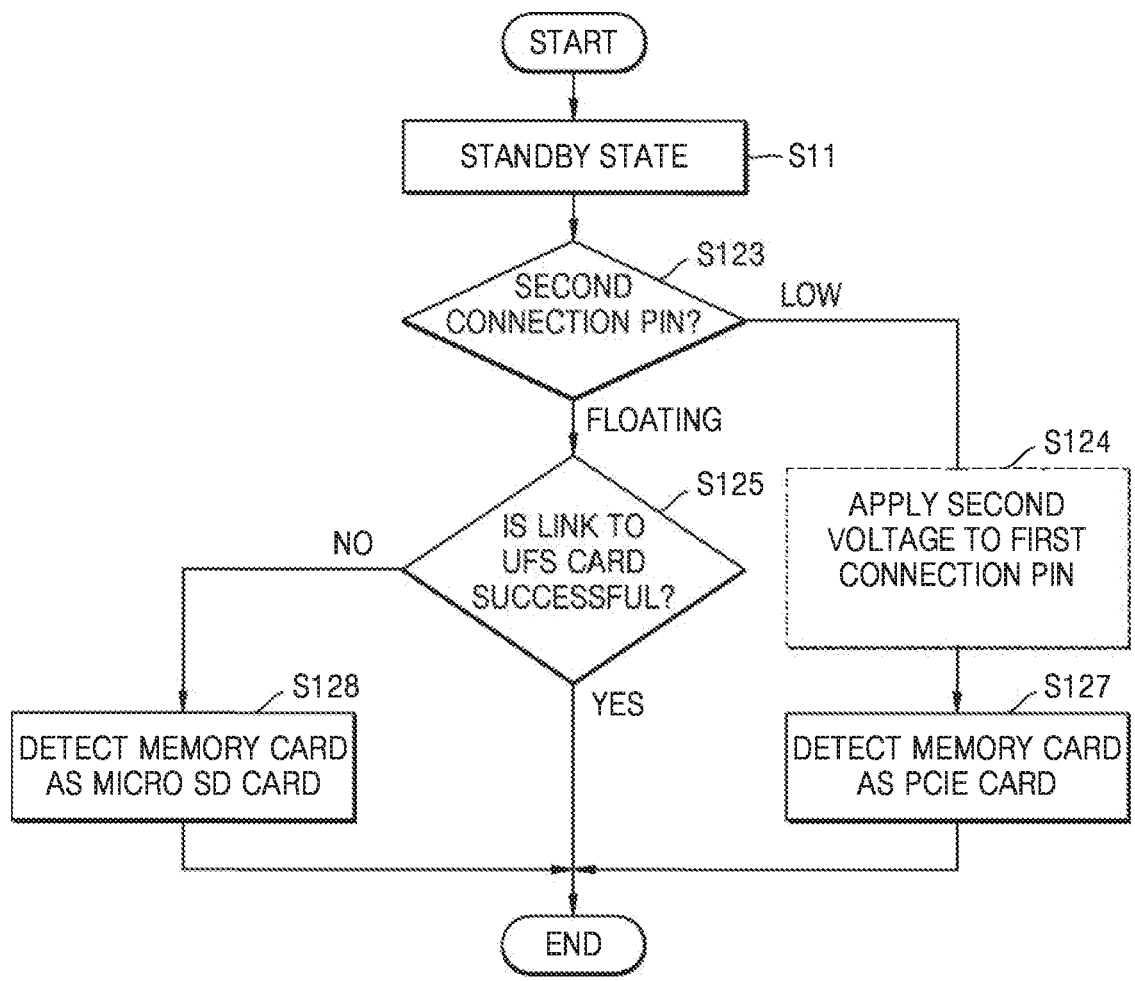

FIG. 19 is a flowchart illustrating a method by which the electronic system 1000a determines a type of memory card inserted in the card socket 1041a, according to another example embodiment.

Referring to FIGS. 8 and 19, before a memory card is inserted, the card socket 1041a may be in a standby state (Operation S11).

When the voltage of the second connection pin H102 is lower than a third reference voltage (e.g., 1.65 volt) when a memory card is inserted, the card detector 1013 may determine that the voltage of the second connection pin H102 is low (Operation S123, LOW), and may detect the memory card inserted in the card socket 1041a as a PCIe card (Operation S127). In some example embodiments, a second voltage (e.g., about 1.2 volt) may be applied to the first connection pin H101 before the card detector 1013 attempts to detect the memory card inserted in the card socket 1041a as a PCIe card (Operation S124).

When the second connection pin H102 is in a floating state (Operation S123, FLOATING), the card detector 1013 may attempt a link to detect the memory card inserted in the card socket 1041a as a UFS card and determine the inserted card as a UFS card when the link is successful (Operation S125, YES). To this end, a power source (e.g., about 1.8 volt) may be supplied to the memory card and the second connection pin H102 may be activated.

When the memory card fails to be detected as a UFS card (Operation S125, NO), the memory card may be detected as a micro SD card.

Although an example in which the electronic system 1000a may detect the micro SD card, the UFS card, and the PCIe card is described in the example embodiment of FIG. 19, the electronic system 1000a may detect only two of the micro SD card, the UFS card, and the PCIe card.

For example, as in the example embodiment shown in FIG. 19, if the voltage of the second connection pin H102 is lower than the third reference voltage when a memory card is inserted, the card detector 1013 may determine that the voltage of the second connection pin H102 is low, and may detect the inserted memory card as a PCIe card. When the second connection pin H102 is in a floating state, the card detector 1013 may activate the second connection pin H102 and detect the inserted memory card as a UFS card.

In another example embodiment, if the second connection pin H102 is in a floating state when a memory card is inserted, the second connection pin H102 may be activated and the card detector 1013 may attempt a link to detect a memory card inserted in the card socket 1041a as a UFS card. When a link to a UFS card is successful, a follow-up work may be performed. On the other hand, when a link to a UFS card fails, the card detector 1013 may detect the memory card inserted in the card socket 1041a as a micro SD card.

In another example embodiment, if the voltage of the second connection pin H102 is lower than the third reference voltage when a memory card is inserted, the card detector 1013 may determine that the voltage of the second connection pin H102 is low, and may detect the inserted memory card as a PCIe card. If the card detector 1013 fails to detect the inserted memory card as a PCIe card, the card detector 1013 may detect the inserted memory card as a micro SD card. In some example embodiments, the second voltage (e.g., about 1.2 volt) may be applied to the first connection pin H101 before the card detector 1013 attempts to detect the memory card inserted in the card socket 1041a as a PCIe card.

Figure 20:
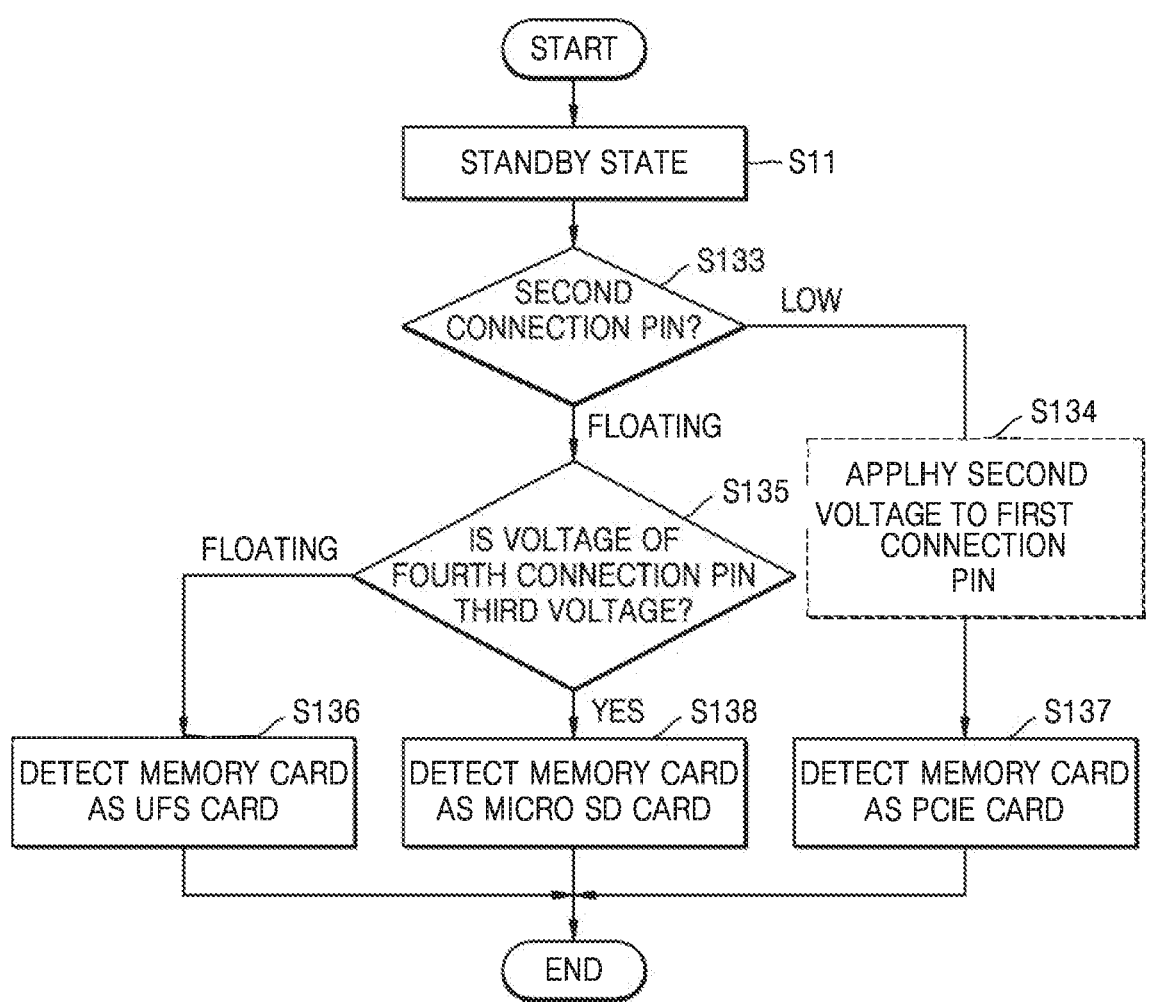

FIG. 20 is a flowchart illustrating a method by which the electronic system 1000a determines a type of memory card inserted in the card socket 1041a, according to another example embodiment.

Referring to FIGS. 8 and 20, before a memory card is inserted, the card socket 1041a may be in a standby state (Operation S11).

If the voltage of the second connection pin H102 is lower than a third reference voltage (e.g., 1.65 volt) when a memory card is inserted, the card detector 1013 may determine that the voltage of the second connection pin H102 is low (Operation S133, LOW), and may detect the memory card inserted in the card socket 1041a as a PCIe card (Operation S137). In some example embodiments, a second voltage (e.g., about 1.2 volt) may be applied to the first connection pin H101 before the card detector 1013 attempts to detect the memory card inserted in the card socket 1041a as a PCIe card (Operation S124).

If the second connection pin H102 is in a floating state (Operation S133, FLOATING), it may be determined whether the voltage of the fourth connection pin H104 is a third voltage (e.g., about 3.3 volt) (Operation S135). If the voltage of the fourth connection pin H104 is the third voltage (Operation S135, YES), the card detector 1013 may detect the memory card inserted in the card socket 1041a as a micro SD card (Operation S138).

When the fourth connection pin H104 is in a floating state (Operation S135, FLOATING), the card detector 1013 may detect the inserted memory card as a UFS card (Operation S136).

Although an example in which the electronic system 1000a may detect the micro SD card, the UFS card, and the PCIe card is described in the example embodiment of FIG. 20, the electronic system 1000a may detect only two of the micro SD card, the UFS card, and the PCIe card.

For example, as in the example embodiment shown in FIG. 20, if the voltage of the second connection pin H102 is lower than the third reference voltage when a memory card is inserted, the card detector 1013 may determine that the voltage of the second connection pin H102 is low, and may detect the inserted memory card as a PCIe card. When both the second connection pin H102 and the fourth connection pin H104 are in a floating state, the card detector 1013 may detect the inserted memory card as a UFS card.

In another example embodiment, when the voltage of the fourth connection pin H104 is the third voltage, the card detector 1013 may detect a memory card inserted in the card socket 1041a as a micro SD card. When both the second connection pin H102 and the fourth connection pin H104 are in a floating state, the card detector 1013 may detect the inserted memory card as a UFS card.

In another example embodiment, if the voltage of the second connection pin H102 is lower than the third reference voltage when a memory card is inserted, the card detector 1013 may determine that the voltage of the second connection pin H102 is low, and may detect the inserted memory card as a PCIe card. When the voltage of the fourth connection pin H104 is the third voltage, the card detector 1013 may detect the inserted memory card as a micro SD card. In some example embodiments, the second voltage (e.g., about 1.2 volt) may be applied to the first connection pin H101 before the card detector 1013 attempts to detect the memory card inserted in the card socket 1041a as a PCIe card.

When the electronic systems 1000 and 1000a are configured as described above and card identification is performed, more than two types of memory cards may be used, and thus, user convenience may be increased.

Figure 21:
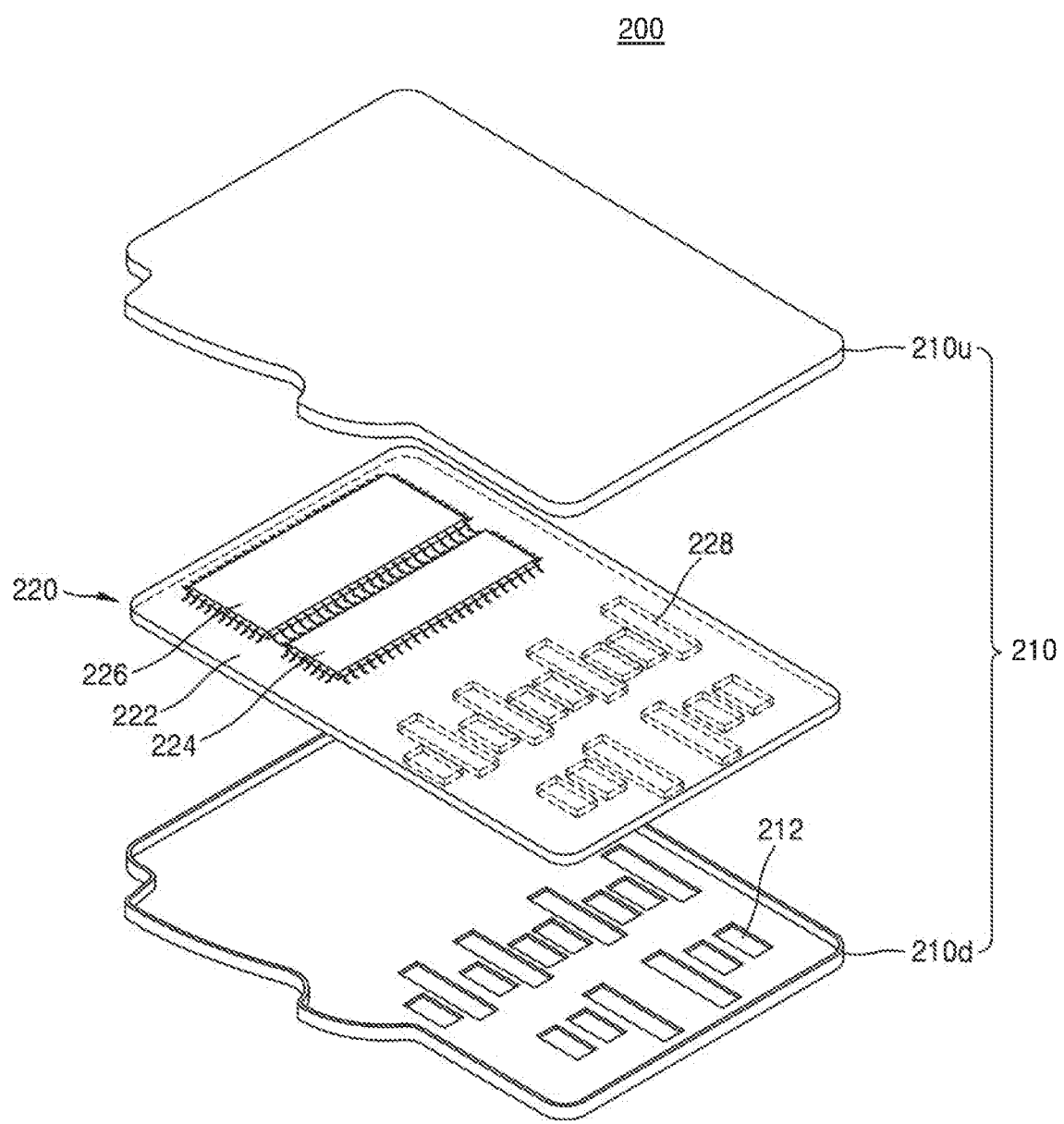
FIG. 21 is an exploded perspective view illustrating a memory card according to an example embodiment.

FIG. 21 is an exploded perspective view illustrating a memory card 200 according to an example embodiment.

Referring to FIG. 21, the memory card 200 may include a card substrate 220 on which semiconductor devices are mounted, and a card enclosure 210 that accommodates the card substrate 220.

The card substrate 220 may include a controller 224 and a memory device 226 on a surface 222 of the card substrate 220. Also, on a surface opposite to the surface 222 of the card substrate 220, connection terminals 228 for connecting to an external device, such as a host, may be provided.

The memory device 226 may be a volatile memory such as a static random access memory (SRAM) or a dynamic random access memory (DRAM), or may be a non-volatile memory such as a NAND flash memory, a VNAND flash memory, PRAM, MRAM, ReRAM, FRAM, or a NOR flash memory.

The controller 224 may include operation modules according to two or more standards to be operable in a plurality of modes. For example, the controller 224 may include an operation module according to a UFS standard to be operable in at least a UFS mode. Furthermore, the controller 224 may further include an operation module for enabling operation in a first sub-mode.

The first sub-mode may be, for example, an operation module according to a micro SD card standard, and particularly, an operation module according to an ultra high speed (UHS)-I micro SD standard, an operation module according to a UHS-II micro SD standard, or an operation module according to a PCIe mode.

In some example embodiments, the controller 224 may be configured to be operable in a UFS mode and two or more sub-modes.

Although the semiconductor devices, i.e., the controller 224 and the memory device 226, are shown in FIG. 21 as being located on the surface 222 opposite to a surface on which the connection terminals 228 are mounted, in some example embodiments the semiconductor devices, i.e., the controller 224 and the memory device 226, and the connection terminals 228 may be located on the same side surface.

The card substrate 220 may be surrounded by the card enclosure 210. The card enclosure 210 may have the form of a case that is separated into upper and lower cases. However, the card enclosure 210 may be molded with a molding resin such as an epoxy molding compound (EMC) to thereby have an integrally encapsulated form. In FIG. 21, an example configuration in which the card substrate 220 has the form of a case is described as an example.

The card enclosure 210 may include an upper enclosure 210u and a lower enclosure 210d. The lower enclosure 210d may be provided with holes 212 through which the connection terminals 228 may be exposed to be electrically connected to an external device.

Figure 22:
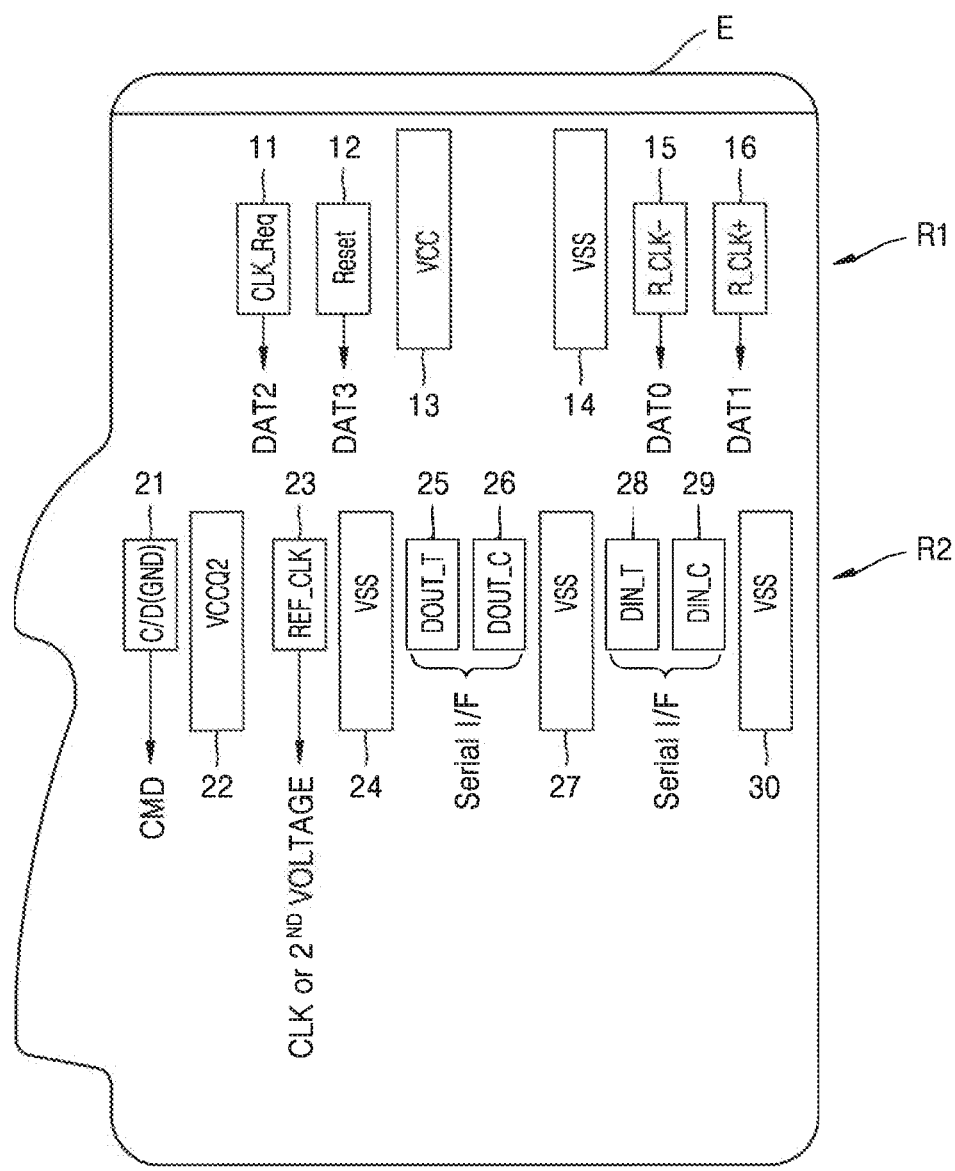
FIG. 22 is a conceptual diagram illustrating an arrangement of terminals of a memory card according to an example embodiment.

FIG. 22 is a conceptual diagram illustrating the terminal arrangement of a memory card 200 according to an example embodiment. However, the terminal arrangement shown in FIG. 22 is an example and the inventive concept is not limited thereto.

Referring to FIG. 22, the memory card 200 may include terminals of a first row R1 adjacent to an insertion side edge E and terminals of a second row R2 arranged apart from the insertion side edge, such that the first row R1 is located between the second row R2 and the insertion side edge. The memory card 200 may include a UFS terminal group according to a UFS standard. The terminals of the second row R2 of the memory card 200 may have the same arrangement as terminals of a second row of a UFS card. However, the inventive concept is not limited thereto.

In some example embodiments, the terminals of the second row R2 may have a different function than the terminals of the second row of the UFS card. For example, a terminal 21 of the memory card 200 may be a command (CMD) terminal, and a terminal of the UFS card which is in the same position as the terminal 21 of the memory card 200 may be in charge of card detection and be grounded. A terminal 23 of the memory card 200 may be a power supply terminal supplied with a second voltage (e.g., 1.2 volt), and a terminal of the UFS card which is in the same position as the terminal 23 of the memory card 200 may be a terminal performing a function of a reference clock REF_CLK.

In some example embodiments, the terminals of the first row R1 may include a power supply terminal (VCC) 13 and a ground terminal (VSS) 14. In FIG. 22, the terminals of the second row R2 and the power supply terminal (VCC) 13 and the ground terminal (VSS) 14 of the first row R1 may constitute the UFS terminal group.

Furthermore, the terminals of the first row R1 may further include a clock request terminal (CLK_Req) 11 and a reset terminal (Reset) 12. In addition, the terminals of the first column R1 may further include a first reference clock terminal (R_CLK−) 15 and a second reference clock terminal (R_CLK+) 16. At least some of the clock request terminal (CLK_Req) 11, the reset terminal (Reset) 12, and the first and second reference clock terminals (R_CLK− and R_CLK+) 15 and 16 may constitute a first sub-mode terminal group. The clock request terminal (CLK_Req) 11, the reset terminal (Reset) 12, and the first and second reference clock terminals (R_CLK− and R_CLK+) 15 and 16 may be used independently or together in a first sub-mode.

In some example embodiments, the clock request terminal (CLK_Req) 11, the reset terminal (Reset) 12, and the first and second reference clock terminals (R_CLK− and R_CLK+) 15 and 16 may be used as data input/output terminals DAT0, DAT1, DAT2, and DAT3. In some example embodiments, terminals that are used as the clock request terminal (CLK_Req) 11, the reset terminal (Reset) 12, and/or the first and second reference clock terminals (R_CLK− and R_CLK+) 15 and 16 in a first operation mode may be used as the data input/output terminals DAT0, DAT1, DAT2, and DAT3 in a second operation mode that is a different operation mode than the first operation mode.

In some example embodiments, the positions of the clock request terminal (CLK_Req) 11, the reset terminal (Reset) 12, and/or the first and second reference clock terminals (R_CLK− and R_CLK+) 15 and 16 may be the same as the positions of data terminals of a UHS-I card.

Since the memory card 200 includes a grounded CD terminal (C/D) 21, the memory card 200 may be detected and operated as a UFS card when it is inserted in a socket for a UFS card. Since the memory card 200 includes the clock request terminal (CLK_Req) 11, the memory card 200 may be detected and operated as a PCIe card when it is inserted in a socket for a PCIe card. Also, since the memory card 200 includes the reset terminal (Reset) 12, the memory card 200 may be detected and operated as a micro SD card when it is inserted in a socket for a micro SD card.

Figure 23A:
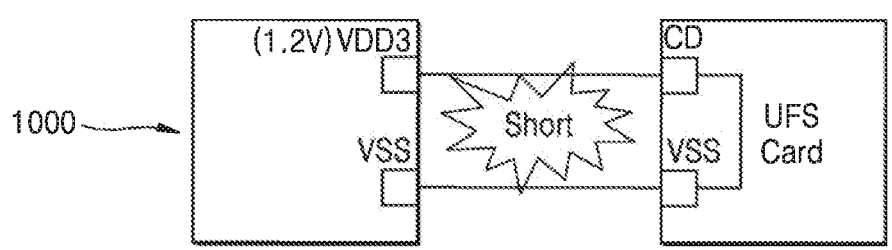
FIG. 23A is a conceptual diagram for explaining a short phenomenon that may occur when a universal flash storage (UFS) card is inserted in a socket for a peripheral component interconnect express (PCIe) card.

FIG. 23A is a conceptual diagram for explaining a short circuit that may occur when a UFS card 200 is inserted in a socket 1000 for a PCIe card.

Referring to FIG. 23A, a card detection terminal CD of the UFS card 200 is connected to a ground terminal VSS. Therefore, the card detection terminal CD may maintain a ground potential. The position of a power supply terminal of a PCIe card may be located at a position corresponding to the position of the card detection terminal CD of the UFS card 200. In this case, when the UFS card 200 is inserted in a socket 1000 for a PCIe card, a power supply terminal VDD3 of a host may be directly connected to the ground terminal VSS and a short circuit may occur, and thus, damage to the host and/or the UFS card 200 may be caused.

Figure 23B:
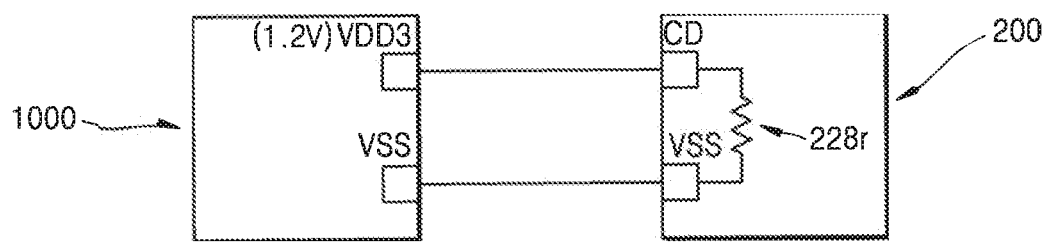
FIG. 23B is a conceptual diagram for explaining a method of preventing the short circuit from occurring even when a UFS card according to a UFS standard is inserted in a socket for a PCIe card, according to an example embodiment.

FIG. 23B is a conceptual diagram of explaining a method for preventing the above-mentioned short circuit from occurring even when a UFS card 200 according to a UFS standard is inserted in a socket 1000 for a PCIe card.

Referring to FIG. 23B, a card detection terminal CD of the UFS card 200 may be connected to a ground terminal VSS through a resistor 228r. With this configuration, since the card detection terminal CD is connected to the ground terminal VSS through the resistor 228r, a short circuit may be prevented and a normal card detection may be achieved. The resistor 228r may have a resistance value of about 1 kΩ to about 1 MΩ. When the resistance value of the resistor 228r is too low, the effect of preventing a short circuit may be insufficient. On the contrary, when the resistance value of the resistor 228r is too high, the cost may increase.

Figure 24:
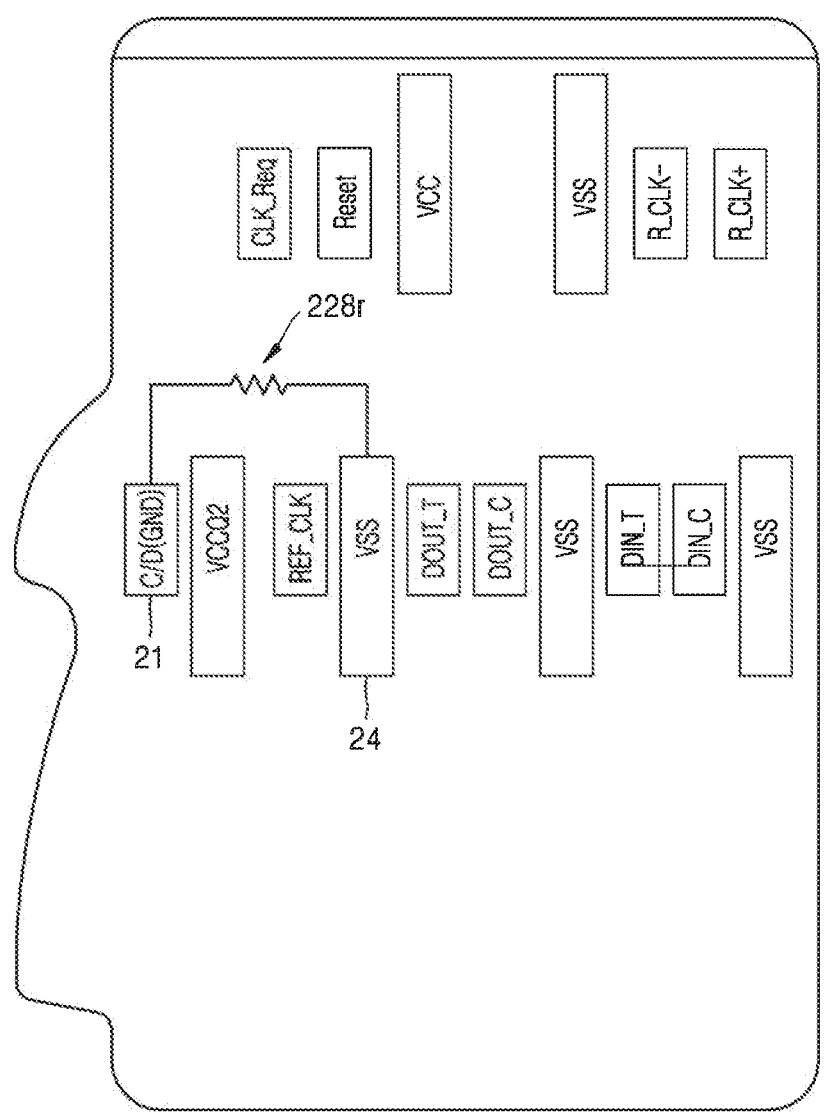
FIGS. 24 and 25 are conceptual diagrams illustrating memory cards according to example embodiments.

FIG. 24 is a conceptual diagram illustrating a memory card 200a according to an example embodiment.

Referring to FIG. 24, a card detection terminal 21 may be connected to a ground terminal 24 through a resistor 228r. The resistor 228r may be mounted on the surface of the card substrate 220 in FIG. 21.

In FIG. 24, one end of the resistor 228r is connected to the card detection terminal 21 and the other end of the resistor 228r is directly connected to the ground terminal 24. However, the other end of the resistor 228r may be connected to any ground terminal.

Figure 25:
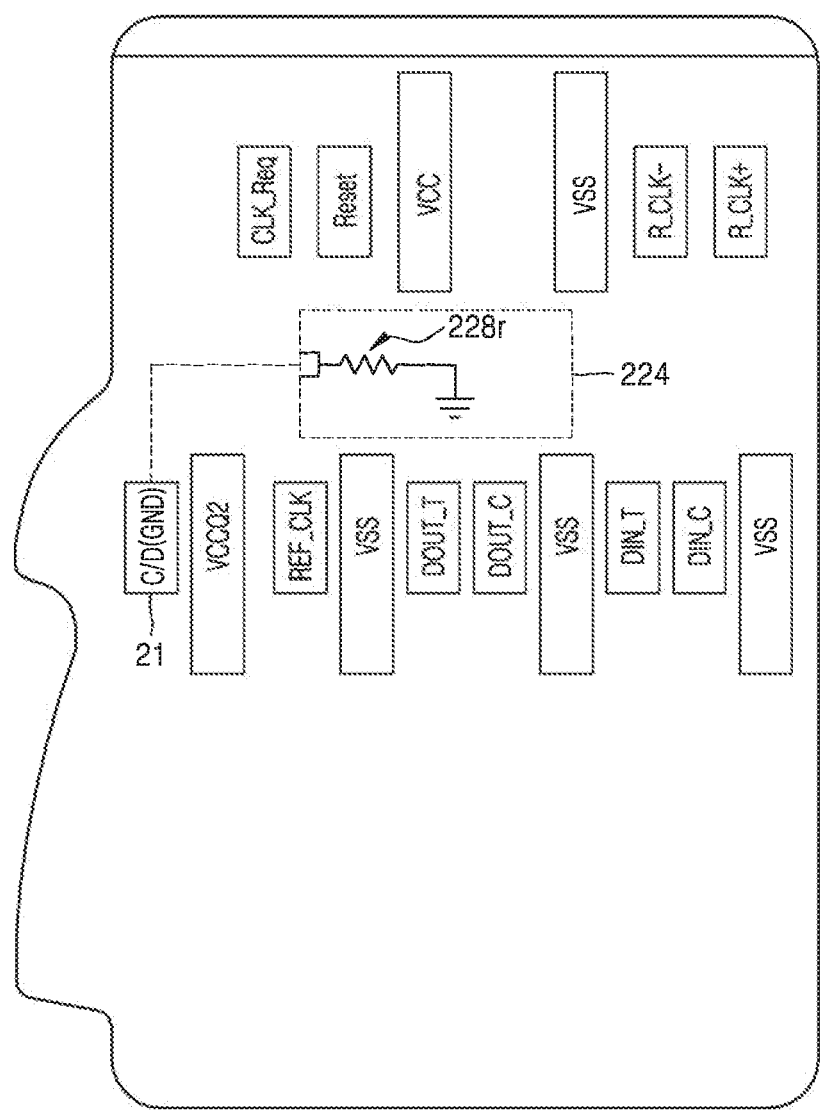

FIG. 25 is a conceptual diagram illustrating a memory card 200b according to another example embodiment.

Referring to FIG. 25, a resistor 228r may be provided in a controller 224. One end of the resistor 228r provided in the controller 224 may be connected to a card detection terminal 21. The other end of the resistor 228r may be connected to a ground terminal, and the ground terminal may be a ground terminal provided in the controller 224, or may be any one of terminals represented by VSS in FIG. 25.

As shown in FIGS. 24 and 25, by providing a resistor that has a proper resistance value, between a card detection terminal and a ground terminal of a UFS card, even if a power supply is connected to the card detection terminal, a short circuit may not occur and damage to semiconductor devices may be prevented.

The memory cards according to the example embodiments are compatible with different types of sockets, which are not UFS standard sockets, and have a low risk of short circuit and thus are very reliable and easy to use.

The electronic system according to the example embodiments may accommodate memory cards of various standards and thus is very reliable and easy to use.

While the inventive concept has been particularly shown and described with reference to example embodiments thereof, it will be understood that various changes in form and details may be made therein without departing from the spirit and scope of the following claims.

What is claimed is:

1. A memory card comprising:
a card substrate on which a controller and a memory device are mounted; and
a card enclosure that accommodates the card substrate and exposes a plurality of terminals for electrical connection to an external device,
wherein the controller is configured to be operable in a universal flash storage (UFS) mode and in a first sub-mode other than the UFS mode, and
wherein the plurality of terminals that are exposed comprise:
a UFS terminal group according to a UFS standard, the UFS terminal group comprising a plurality of first row terminals arranged adjacent to an insertion side edge of the memory card and a plurality of second row terminals arranged apart from the insertion side edge such that the plurality of first row terminals are provided between the plurality of second row terminals and the insertion side edge; and a first sub-mode terminal group adjacent to the plurality of first row terminals.

2. The memory card of claim 1, wherein the first sub-mode terminal group comprises a first sub-mode reset terminal and a first sub-mode clock request terminal.

3. The memory card of claim 2, wherein the first sub-mode terminal group further comprises a first reference clock terminal and a second reference clock terminal.

4. The memory card of claim 1, wherein the controller is configured to be operable in a second sub-mode other than the UFS mode and the first sub-mode.

5. The memory card of claim 4, wherein the first sub-mode terminal group is configured to act as a plurality of data terminals in the second sub-mode.

6. The memory card of claim 5, wherein the first sub-mode terminal group comprises a plurality of first sub-mode terminals and first positions of the plurality of first sub-mode terminals are substantially the same as second positions of a plurality of UHS data terminals of an ultra high speed (UHS)-I card.

7. The memory card of claim 1, wherein the first sub-mode is a UHS-I mode, a UHS-II mode, or a peripheral component interconnect express (PCIe) mode.

8. The memory card of claim 1, wherein the plurality of second row terminals comprise a card detection (CD) terminal for UFS memory card recognition, wherein the CD terminal is connected to a resistor of 1 kΩ to 1 MΩ and the resistor is directly electrically connected to a ground terminal.

9. The memory card of claim 8, wherein the resistor is a resistance element mounted on the card substrate.

10. The memory card of claim 8, wherein the resistor is a resistance element in the controller.

11. A memory card comprising:

a card substrate on which a controller and a memory device are mounted; and a card enclosure that accommodates the card substrate and exposes a plurality of terminals for electrical connection to an external device, wherein the controller is configured to be operable in a universal flash storage (UFS) mode and in a first sub-mode other than the UFS mode, and wherein the plurality of terminals that are exposed comprise a UFS terminal group according to a UFS standard, the UFS terminal group comprising a plurality of first row terminals arranged adjacent to an insertion side edge of the memory card and a plurality of second row terminals arranged apart from the insertion side edge such that the plurality of first row terminals are provided between the plurality of second row terminals and the insertion side edge;

wherein the plurality of second row terminals comprise a card detection (CD) terminal for UFS memory card recognition, and wherein the CD terminal is connected to a resistor, the resistor being directly electrically connected to a ground terminal.

12. The memory card of claim 11, wherein the resistor a resistance element of 1 kΩ to 1 MΩ mounted on the card substrate.

13. The memory card of claim 11, wherein the resistor a resistance element of 1 kΩ to 1 MΩ in the controller.

14. The memory card of claim 11, wherein the plurality of second row terminals further comprise reference clock terminal, a first ground terminal, a pair of data output terminals, a second ground terminal, a pair of data input terminals, and a third ground terminal in this order from the CD terminal under the UFS mode, and wherein the ground terminal to which the resistor is directly electrically connected is at least one of the first ground terminal, the second ground terminal or the third ground terminal.

15. The memory card of claim 14, wherein the CD terminal for UFS memory card recognition is configured to function as a power supply terminal under the first sub-mode.

16. The memory card of claim 15, wherein the power supply terminal is configured to be supplied with a power of about 1.2 V.

17. The memory card of claim 14, wherein the reference clock terminal for UFS memory card recognition is configured to function as a power supply terminal under the first sub-mode.

18. The memory card of claim 14, further comprising a first sub-mode terminal group adjacent to the plurality of first row terminals, the first sub-mode terminal group comprising a first sub-mode reset terminal and a first sub-mode clock request terminal.

19. The memory card of claim 18, wherein the first sub-mode terminal group further comprises a first reference clock terminal and a second reference clock terminal.

20. A memory card comprising:

a card substrate on which a controller and a memory device are mounted; and a card enclosure that accommodates the card substrate and exposes a plurality of terminals for electrical connection to an external device, wherein the controller is configured to be operable in a universal flash storage (UFS) mode and in a first sub-mode other than the UFS mode, wherein the plurality of terminals that are exposed comprise a UFS terminal group according to a UFS standard, the UFS terminal group comprising a plurality of first row terminals arranged adjacent to an insertion side edge of the memory card and a plurality of second row terminals arranged apart from the insertion side edge such that the plurality of first row terminals are provided between the plurality of second row terminals and the insertion side edge; and a first sub-mode terminal group adjacent to the plurality of first row terminals, wherein the plurality of second row terminals comprise a card detection (CD) terminal for UFS memory card recognition, wherein the CD terminal is connected to a resistor, the resistor being directly electrically connected to a ground terminal, and wherein the first sub-mode terminal group comprises a first sub-mode reset terminal, a first sub-mode clock request terminal, a first reference clock terminal and a second reference clock terminal.

* * * * *